United States Patent [19]

O'Shaughnessy et al.

[11] Patent Number: 4,947,063
[45] Date of Patent: Aug. 7, 1990

[54] METHOD AND APPARATUS FOR REDUCING TRANSIENT NOISE IN INTEGRATED CIRCUITS

[75] Inventors: Timothy G. O'Shaughnessy, Norco; David K. Chung, Lake Elsinore; Richard W. Hull, Laguna Hills; Kenneth W. Ouyang, Huntington Beach; Victor G. Pierotti, Anaheim; Joseph A. Souza, Costa Mesa, all of Calif.

[73] Assignee: Western Digital Corporation, Irvine, Calif.

[21] Appl. No.: 161,469

[22] Filed: Feb. 26, 1988

Related U.S. Application Data

[63] Continuation of Ser. No. 107,496, Oct. 9, 1987, abandoned, which is a continuation-in-part of Ser. No. 35,602, Apr. 7, 1987, abandoned, and Ser. No. 67,467, Jun. 26, 1987, abandoned.

[51] Int. Cl.[5] .......................... H03K 4/26; H03K 5/01; H03K 17/16
[52] U.S. Cl. .................................... 307/572; 307/246; 307/270; 307/443; 307/491; 307/542
[58] Field of Search ............... 307/270, 443, 491, 542, 307/572, 576, 246, 303

[56] References Cited

U.S. PATENT DOCUMENTS

| | | |
|---|---|---|
| 4,609,834 | 9/1986 | Gal .................................. 307/443 |
| 4,612,457 | 9/1986 | Prater ............................... 307/443 |
| 4,698,525 | 10/1987 | Tavana et al. ....................... 307/443 |
| 4,740,717 | 4/1988 | Fletcher ............................ 307/451 |
| 4,758,743 | 7/1988 | Dehganpour et al. ............. 307/443 |
| 4,783,601 | 11/1988 | Hartgring et al. .................. 307/448 |
| 4,785,201 | 11/1988 | Martinez ........................... 307/263 |
| 4,789,796 | 12/1988 | Foss ................................. 307/246 |
| 4,791,321 | 12/1988 | Tanaka et al. ..................... 307/451 |

Primary Examiner—John Zazworsky
Attorney, Agent, or Firm—Christie, Parker & Hale

[57] ABSTRACT

The transient noise generated at the output drivers of an integrated circuit chip is reduced by maintaining an increasing ramp shaped current through each output driver during the entire transition interval between binary states of a capacitive load. A capacitor fed by a fixed current source is connected across the input of each output driver stage. The fixed current source and capacitor are so selected as to generate across the input of each output driver stage a linear ramp shaped control voltage that regulates the charging/discharging current through the output driver stage and package inductance in the described manner. A specially designed bias circuit reduces the sensitivity of the resulting transient noise to process variations and operating conditions. A feedback connection from the package inductance to the bias control circuit for the fixed current source adjusts the fixed current inversely with the transient noise. A dynamic clamp suppresses voltage spikes extending outside the voltage supply operating range. A bias circuit arrangement compensates for sheet resistivity of the integrated circuit chip. If the resistance value of the sheet drops below a prescribed value, the fixed current is limited so it cannot exceed its designed value.

85 Claims, 13 Drawing Sheets

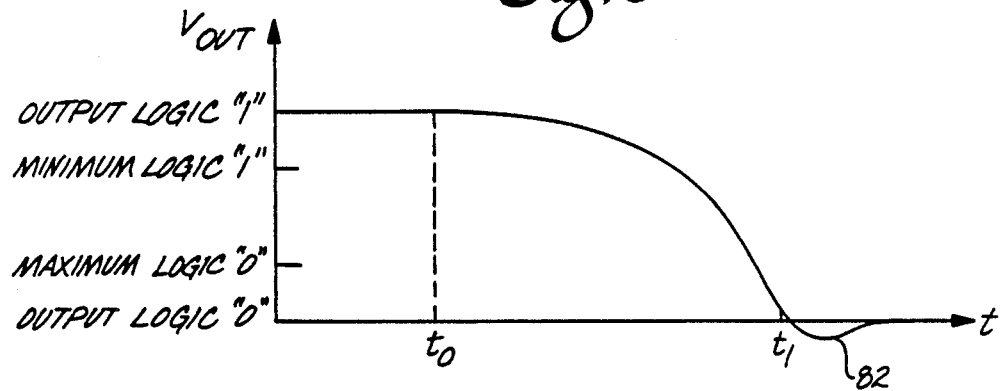
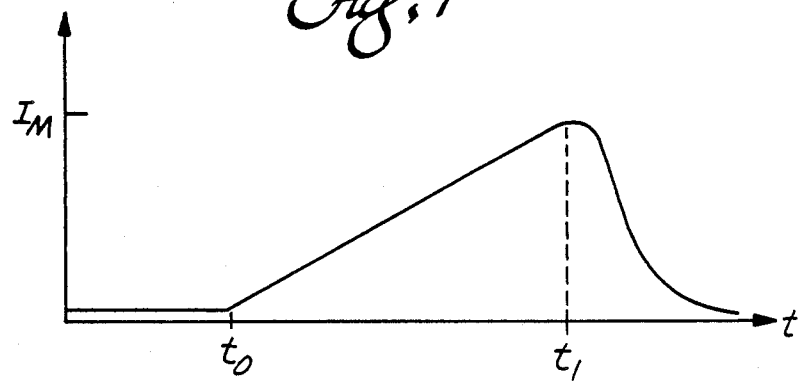
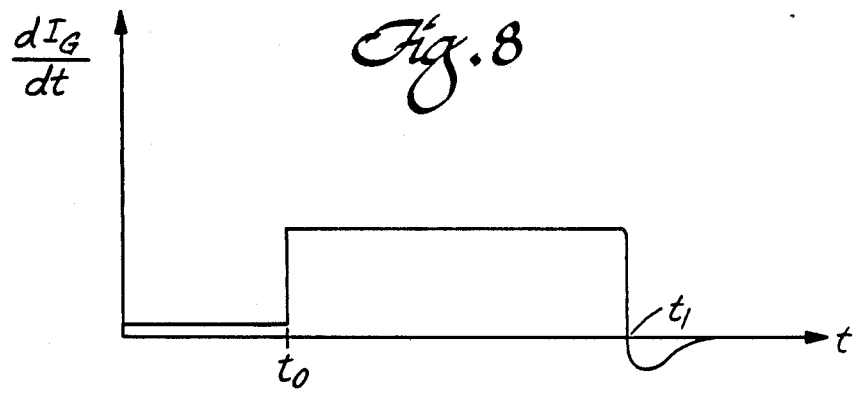

METHOD AND APPARATUS FOR REDUCING TRANSIENT NOISE IN INTEGRATED CIRCUITS

REFERENCE TO CO-PENDING APPLICATIONS

This is a continuation of application Ser. No. 07/107,496, filed on Oct. 9, 1987, now abandoned, which is a continuation-in-part of Ser. No. 07/035,602, filed on Apr. 7, 1987, now abandoned and Ser. No. 07/067,467, filed on June 26, 1987 now abandoned. The disclosures of these applications are incorporated fully herein by reference.

BACKGROUND OF THE INVENTION

This invention relates to noise reduction in integrated circuits and, more particularly, to a method and apparatus for reducing the transient noise generated during operation of the output drivers of an integrated circuit.

Digital data processing systems are typically built from integrated circuits that incorporate on a single chip thousands of binary circuit elements such as registers, logic gates and input and output circuits. Generally, an integrated circuit chip processes a number of parallel channels of data, e.g. eight, sixteen or thirty-two. The integrated circuits are mounted on printed circuit boards having conductive paths that interconnect the input and output circuits on the integrated circuit chips and supply thereto operating power supply voltage. An integrated circuit chip is conventionally incorporated into a package that has a number of leads connecting the integrated circuits on the chip to the printed circuit board. Since the output driver channels of an integrated circuit chip are connected through the package leads "off chip" to the conductive paths on the printed circuit board, they must be designed to drive a large capacitive load.

An integrated circuit chip has parasitic inductance, called package inductance, which is representative of the inductance of the conductive paths from the integrated circuit chip to the power supply potentials on the printed circuit board in which the integrated circuit chip is mounted. Usually, the internal conductive path in the package between the integrated circuit chip and the package lead comprises most of the package inductance.

It is common practice in the design of integrated circuit chips to employ a single package lead for the connections of all or many of the parallel channels to the power supply potentials off chip. In such case, the output drivers of all the channels driven toward a power supply potential during any single switching interval contribute to the transient noise due to package inductance.

During the past several years, there has been increasing awareness of the problems resulting from the transient noise generated within large scale integrated (LSI) circuits, and in particular the noise associated with CMOS logic. The major problems occur from the simultaneous switching of multiple output drivers designed to drive high capacitance loads, such as the data bus of microprocessors or the address bus of a large memory array. Under most conditions, the transient current at power supply nodes resulting from switching multiple output drivers, tends to be additive. Therefore, even a small value of package inductance produces serious noise problems.

The problem has become more acute and apparent, because evolving technology tends to produce LSI circuits with higher performance. By decreasing the time to perform logical operations, by decreasing the delay of the output driver, by increasing the effective data rate on the outputs, or by increasing the specified load capacitance, then, more charge must be transferred in a shorter interval of time. Often, during the design of a conventional MOS output driver, the design engineer assumes the worst case model parameters of the fabrication process and the worst case operating conditions. To realize the worst case maximum specified delay the designer must utilize a large W/L on the output MOS devices to drive the load capacitance at high temperature, minimum power supply voltage and slow process parameters. However, the worst case noise is produced at low temperature, maximum power supply voltage, and fast process parameters. Under worst case noise conditions the delay decreases and the noise increases often by an order of magnitude. Several techniques attempt to control or limit the worst case rate of current change (dI/dt) during the transient on the output. However, most techniques incur the penalty that the worst case delay must increase.

SUMMARY OF THE INVENTION

According to the invention, the transient noise generated at the output drivers of an integrated circuit chip is reduced by maintaining an increasing ramp shaped current through each output driver during the entire transition interval between binary states of a capacitive load. As a result, during transfer of the charge to or from the capacitive load, the transient noise generated due to package inductance is minimized.

Preferably, a capacitor fed by a fixed current source is connected across the input of each output driver stage. The fixed current source and capacitor are so selected as to generate across the input of each output driver stage a linear ramp shaped control voltage that regulates the charging/discharging current through the output driver stage and package inductance in the described manner.

A feature of the invention is a specially designed bias circuit that reduces the sensitivity of the resulting transient noise to process variations and operating conditions. Preferably this is implemented by circuitry that forms a pair of current mirrors in unity gain feedback.

Another feature of the invention is a feedback connection from the package inductance to the bias control circuit for the fixed current source to adjust the fixed current inversely with the transient noise. As a result, the large transient noise caused by the switching of many output driver stages is suppressed by reducing the rate of change of the charging/discharging current.

Another feature of the invention is a dynamic clamp to suppress voltage spikes extending outside the voltage supply operating range.

Another feature of the invention is a bias circuit arrangement to compensate for sheet resistivity of the integrated circuit chip. If the resistance value of the sheet drops below a prescribed value, the fixed current is limited so it cannot exceed its designed value.

BRIEF DESCRIPTION OF THE DRAWINGS

The features of specific embodiments of the best mode contemplated of carrying out the invention are illustrated in the drawings, in which:

FIGS. 6 to 8 are wave forms illustrating the operation of the output driver of FIG. 5;

DETAILED DESCRIPTION OF THE SPECIFIC EMBODIMENTS

Figure 1:
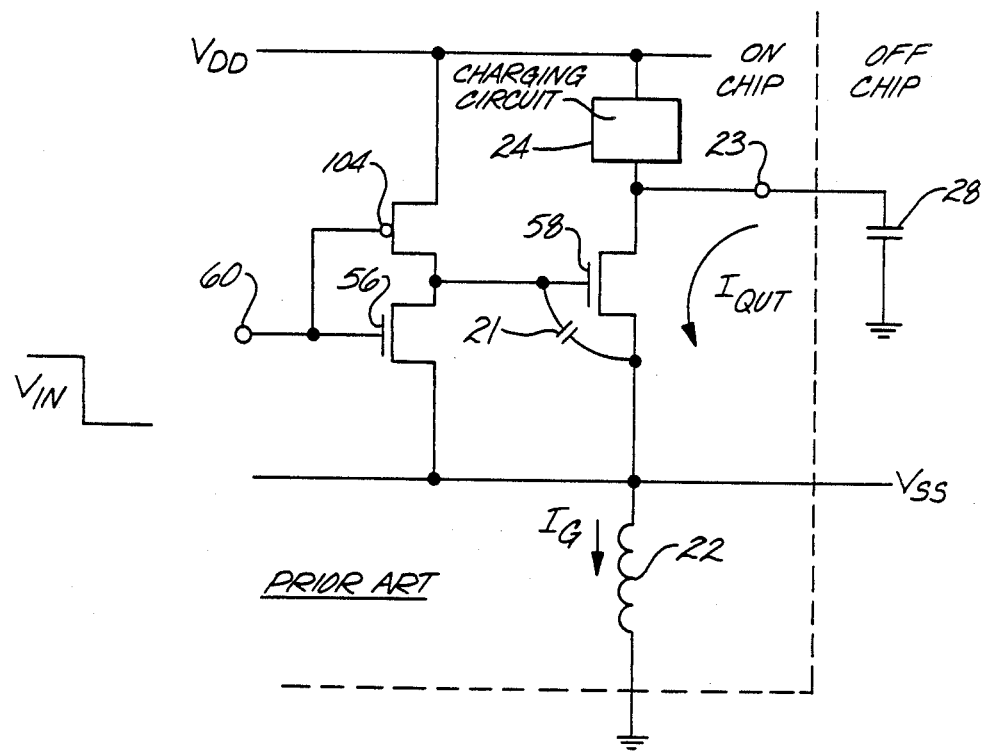
FIG. 1 is a schematic circuit diagram of a prior art integrated circuit output driver channel.

The present invention is generally applicable to binary electronic circuitry for driving capacitive loads, particulary in the environment of integrated circuits. Integrated circuit chips are usually incorporated into packages that have a number of leads connecting the integrated circuits to each other. The integrated circuits are generally mounted on circuit boards that have conductive paths to form the interconnections between integrated circuits, and to bus power supply potentials to the integrated circuits. An integrated circuit usually processes a number of parallel channels of data, e.g., eight, sixteen or thirty-two. It is particularly advantageous to employ the invention for multiple output driver stages of an integrated circuit. Since these output stages are connected through the package leads "off chip" to conductive paths on a printed circuit board, they must be designed to drive large capacitive loads.

In the drawings, common reference numerals are used to identify the same components of the various embodiments of the prior art and the invention.

In FIG. 1, a typical prior art integrated circuit output driver channel, has as an output driver stage, an N-channel MOS transistor 58, and a complementary predriver stage having an N-channel MOS transistor 56 and a P-channel MOS transistor 104 all formed on the integrated circuit chip. Power supply potentials are bussed from "off chip", i.e. from the printed circuit board on which the chip is mounted, through package leads to the circuitry "on chip", where it is distributed by leads $V_{DD}$ and $V_{SS}$. Although $V_{DD}$ and $V_{SS}$ could be at any different potentials, it is assumed for discussion that $V_{DD}$ is connected to a positive potential bus and $V_{SS}$ is connected to a ground bus. A package inductance 22 connected between $V_{SS}$ and the ground bus off chip represents the parasitic inductance of the conductive path from the chip to the printed circuit bus. Usually, the internal conductive path in the integrated circuit package between the chip and the package lead comprises most of package inductance 22. Although there is a similar parasitic package inductance between the positive potential bus and $V_{DD}$, it is not represented in FIG. 1. This package inductance generally does not adversely effect the operation of the output drivers as much as the parasitic ground package inductance because the electrical specification of the logic-0 voltage level during the high to low output transitions have less margin to transient noise than the logic-1 voltage level during the low to high transitions. An input terminal 60 is connected to the gates of transistors 56 and 104. The source of transistor 104 is connected to $V_{DD}$, the drain of transistor 104, the drain of transistor 56 and the gate of transistor 58 are connected together. The source of transistor 56 and the source of transistor 58 are connected to $V_{SS}$. The drain of transistor 58 is connected to a charging circuit 24 to $V_{DD}$ and to an output terminal 23. Output terminal 23 is connected to a data output package lead on the integrated circuit. When connected to a circuit path off chip, output terminal 23 in effect sees a large capacitive load 28 which comprises the package lead conductive paths on the printed circuit board and the input capacitance of the circuitry being driven.

In operation, a binary signal $V_{IN}$ representing a channel of data is applied to input terminal 60. When the binary signal changes from a high state to a low state, transistor 104 turns on and transistor 56 turns off. As a result, $V_{DD}$ is applied to the gate of transistor 58, which has an internal gate to source capacitance represented as 21. When $V_{DD}$ is applied to the gate of transistor 58, it turns on and load capacitance 28 discharges through transistor 58 and package inductance 22 to ground. The output drivers of all the channels on the integrated chip are similarly connected to $V_{DD}$ and $V_{SS}$.

Figure 2:
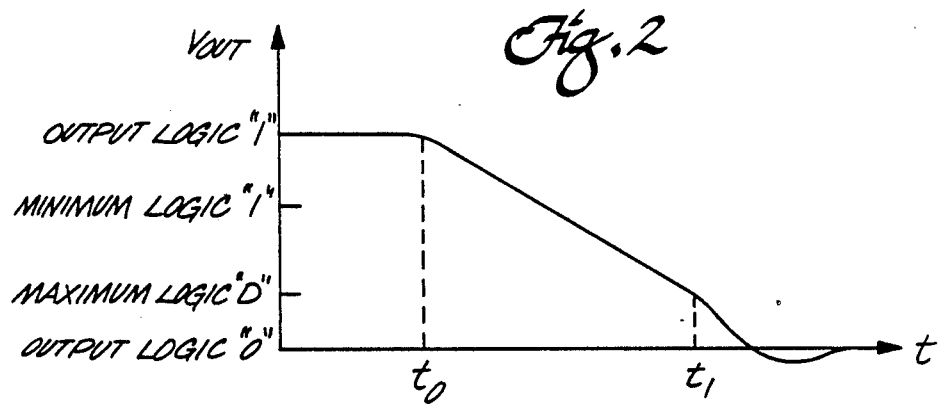
FIGS. 2 to 4 are wave forms illustrating the operation of the prior art output driver of FIG. 1.
Figure 3:
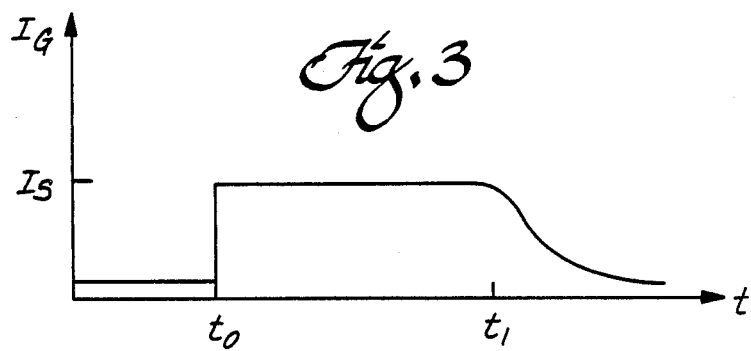
Figure 4:
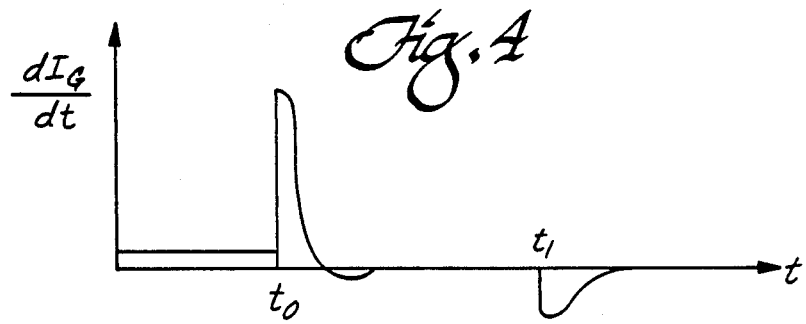

FIG. 2 represents the voltage, $V_{OUT}$, at output terminal 23 during the high to low transition of $V_{IN}$; $t_0$ represents the beginning of the transition interval of the change of state at output terminal 23 at which $V_{OUT}$ starts to leave a binary "1" voltage level and $t_1$ represents the end of the transition interval of the change of state at output terminal 23 at which $V_{OUT}$ reaches a valid binary "0" voltage level. As depicted after transistor 58 turns on, the voltage at output terminal 23 drops approximately linearly until the transition is completed at a time $t_1$. The period between $t_1$ and $t_0$, which varies from chip to chip depending on manufacturing process variations, is referred to hereafter as the transition interval. In a typical CMOS transistor design, the high threshold at output terminal 23 for low to high transitions could be about 2.0 volts, the low threshold at output terminal 23 for high to low transitions could be about 0.8 volts, and the typical transition interval could be between about 10 and 40 nanoseconds (ns). In such case a typical minimum period between successive transitions of the output drivers, i.e., the bit period, could be of the order of 80 nanoseconds. FIG. 3 represents the discharge current, $I_G$, passing through transistor 58 and package inductance 22 during a high to low transition. As illustrated, this current rises sharply when transistor 58 turns on at $t_0$ and stays approximately constant at a short circuit sink current value, $I_S$, during the remainder of the transition interval. FIG. 4 represents the rate of current change, $dI_G/dt$, through package inductance 22 during the high to low transition, which is proportional to the transient noise voltage generated during the transition. As illustrated, a large narrow noise voltage spike is produced at $t_0$. Typically, all or many of the output driver channels are connected to the same package lead, which causes an additive effect of the transient noise due to package inductance for all the output driver channels switching from high to low during the transition interval.

The foregoing description does not take into account the effect of internal capacitance 21. This internal capacitance tends to delay and reduce somewhat the slope of the voltage $V_{OUT}$ at output terminal 23. It also causes the discharge current $I_G$ to rise more gradually than shown in FIG. 3 to form a ramp-like leading edge and to reduce somewhat the transient voltage spike represented in FIG. 4. However, the duration and slope of the ramp, being a function of the internal capacitance of transistor 58 and the charging current, are not controlled and the ramp occurs only over a small portion of the transition interval.

When the voltage $V_{IN}$ applied to input terminal 60 goes from low to high, $V_{DD}$ is applied through a charging circuit 24 to load capacitance 28 to charge load capacitance 28. Charging circuit 24 could comprise a simple charging resistor or a switch comprising a transistor that turns on during the charging interval and turns off outside the charging interval.

Figure 5:
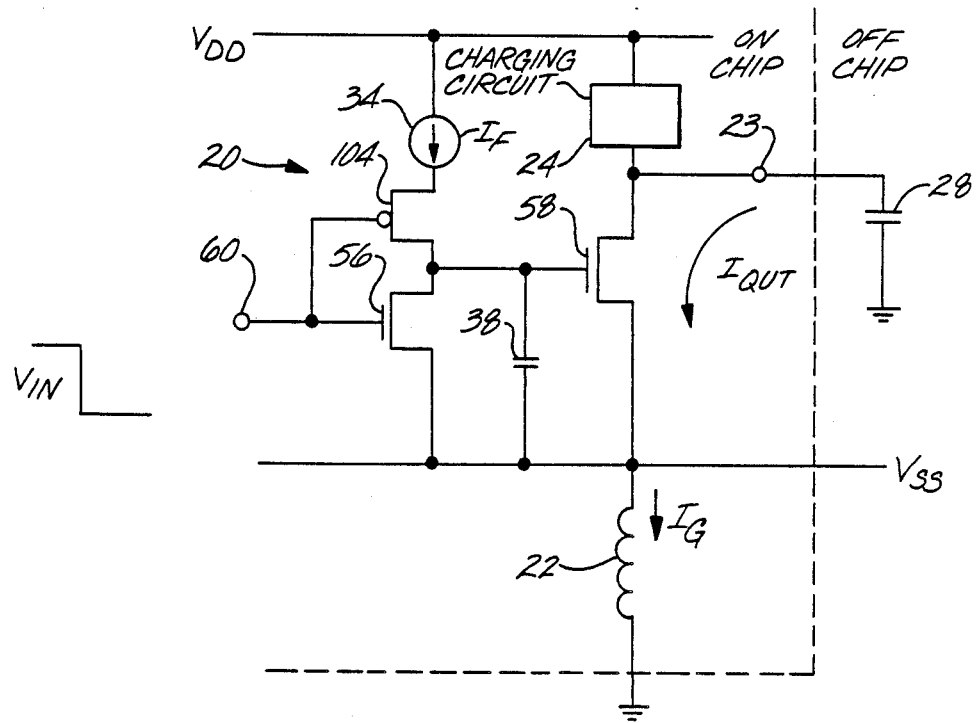
FIG. 5 is a schematic circuit diagram of an integrated circuit output driver channel incorporating principals of the invention.

The broader aspects of the invention are illustrated by an output driver 20 in FIG. 5. A capacitor 38 is connected between the gate of transistor 58 and $V_{SS}$. Capacitor 38 represents the combined capacitance of discrete capacitor and/or the usually smaller internal gate-source capacitance of transistor 58. A source 34 of fixed bias current $I_F$ is connected between $V_{DD}$ and the source of transistor 104. The bias current $I_F$ is fixed in the sense that it is constant throughout the transition interval irrespective of changes in the input impedance of transistor 58. When the voltage $V_{IN}$ across input terminal 60 goes from high to low, the fixed current $I_F$ is applied by transistor 104 to capacitor 38. As a result, an approximately linear ramp-shaped control voltage is generated across capacitor 38 during the entire transition interval. After the transition interval, the transistor in current source 34 eventually saturates and the current produced thereby drops. According to the invention, transistor 58 serves not only as a switch but also as a transconductance device to control the rate of the current change passing through transistor 58 and package inductance 22. Specifically, the discharge current $I_G$ has an approximately linear ramp-shape over the entire transition interval, i.e. the rate of current change, i.e. slope is approximately constant. In other words, discharge current $I_G$ at the end of the transition interval $t_1$, which is designated $I_M$ in FIG. 7, is equal to twice the minimum value of the current $I_s$ in FIG. 3 necessary to discharge the load capacitance from high to low during the transition interval, $t_1$-$t_0$. As depicted in FIG. 6, this produces a voltage $V_{OUT}$ across output terminal 23 that changes slowly during the first half of the transition interval and changes rapidly during the second half of the transition interval. In effect, initially the output voltage, is delayed relative to the transition of the input voltage up to $t_1$, but the output voltage has a sharper transition than in the prior art such that at $t_1$ the same output voltage occurs for the worst case conditions stated. (Compare FIG. 2.) As depicted in FIG. 7, the discharge current $I_G$ rises approximately linearly, during the entire discharge interval, which, as depicted in FIG. 8, gives rise to an approximately constant transient noise voltage. Assuming the same charge is to be transferred from the load capacitance, the area under the curve of FIG. 7 during the transition interval is the same as that in the prior art (FIG. 3) but the discharge current $I_G$ at the end of the transition interval, i.e. at $t_1$, is twice that of the prior art. Therefore, under an equivalent worst case condition of minimum power supply voltage and maximum temperature, the invention establishes the same required output voltage at $t_1$ as the prior art. Yet the discharge current, $I_G$, passing through package inductance 22 is increased in ramp shaped fashion, preferably at a constant rate, over the entire transition interval so as to minimize the rate of current change through package inductance 22, and thus the transient noise voltage induced thereby.

Figure 9:
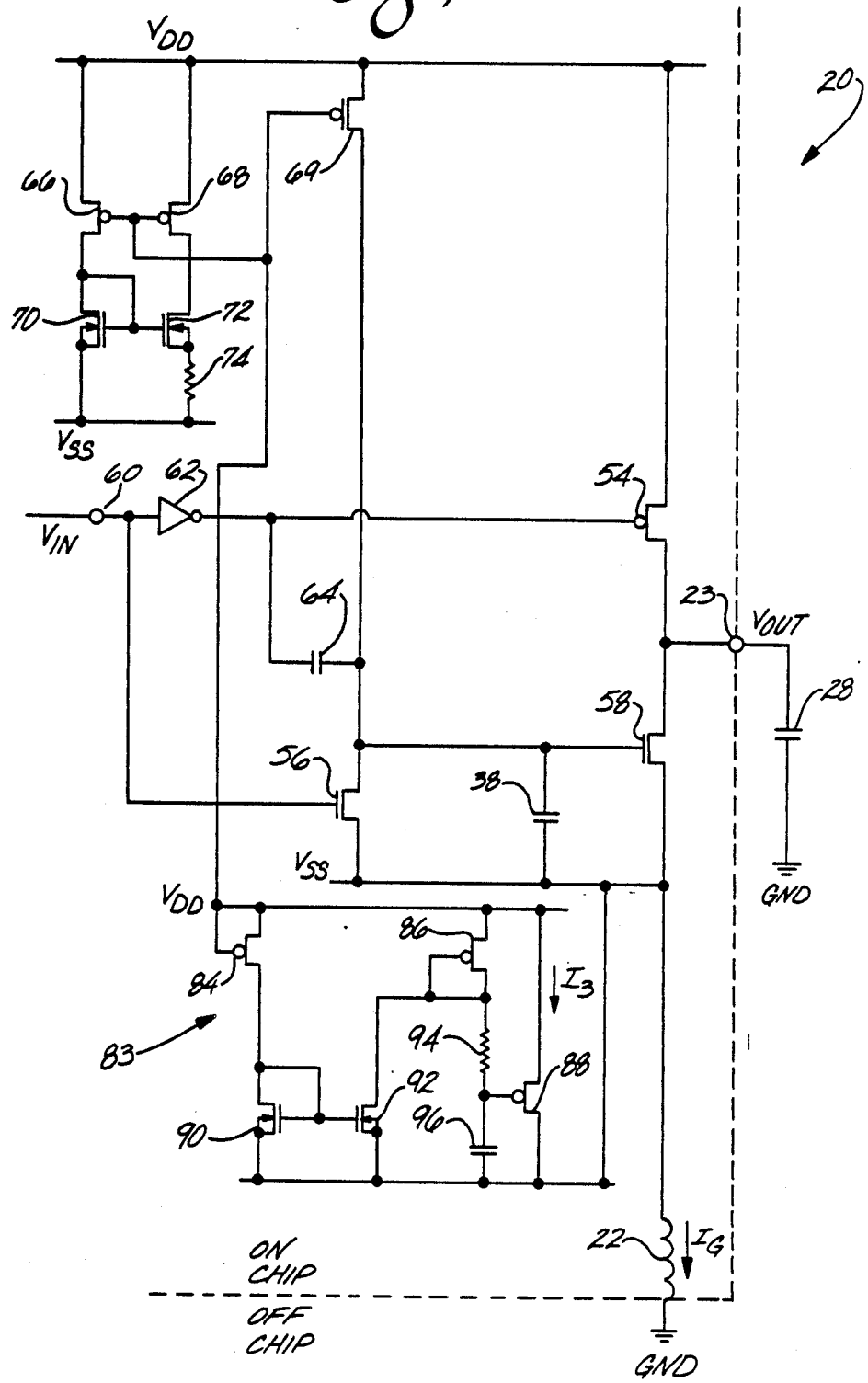
FIG. 9 is a schematic circuit diagram of an output driver channel incorporating the preferred bias circuitry for the fixed current source and the dynamic clamp.

FIG. 9 illustrates a more detailed embodiment of the output driver of the present invention in which charging circuit 24 in FIG. 5 takes the form of a P-channel MOS transistor 54. Prior to activation of the output driver, the input voltage signal $V_{IN}$ at the input terminal 60 of the output driver is high. The P-channel transistor 54 located between the power supply voltage $V_{DD}$ and the load capacitance 28 is therefore conductive, allowing the power supply voltage $V_{DD}$ to charge the load capacitance 28. The N-channel transistor 56 is also conductive. The opposed terminals of the capacitor 38 are therefore shorted and the capacitor 38 remains uncharged. The high input voltage signal $V_{IN}$ is applied to the gate of the N-channel transistor 56, making transistor 56 electrically conductive, and transistor 58 nonconductive. The package inductance 22 is thus electrically isolated from the load capacitance 28.

The output driver becomes activated to discharge load capacitance 28 when the input voltage signal $V_{IN}$ changes from high to low. The N-channel transistor 56 becomes nonconductive, allowing the fixed, i.e. constant, current from the current source formed by transistor 69 and the circuitry for biasing its gate to begin charging the capacitor 38. A linearly increasing voltage is therefore applied to the gate of the N-channel transistor 58. Simultaneously, P-channel transistor 54 turns off, electrically isolating the load capacitance 28 from the power supply voltage $V_{DD}$. The charge stored on the load capacitance 28 therefore commences to discharge through transistor 58. Since transistor 58 behaves as a transconductance element to control its output current to assume the same function over time as the voltage applied to its gate, i.e. to follow the gate voltage, and the voltage applied to the gate of the transistor 58 is linearly increasing in form, the N-channel transistor 58 begins to conduct a linearly increasing level of current $I_G$ to the package inductance 22. The rate of change of current $I_G$ passing through the package inductance 22 is therefore constant for a period of time, minimizing the level of switching noise generated during activation of the output driver.

As illustrated in FIG. 9, several additional refinements may also be made. First, an inverter 62 and a capacitor 64 may be provided between input terminal 60 and the gate of the transconductance transistor 58. The capacitor 64 functions to transfer a charge to bias the gate of the transistor 58 to have a gate voltage just below its threshold immediately prior to activation of the output driver by the input voltage $V_{IN}$. Only a minimal level of additional voltage therefore must be applied to the gate of the transistor 58 to make it conductive, speeding up the response time of the output driver 20 upon the change of state of the input voltage $V_{IN}$.

A second refinement may be made to the output driver by replacing the fixed bias current source 34 illustrated in FIG. 5 with a modified, compensating bias current source, as illustrated in FIG. 9. When using a MOS transistor 58 as the transconductance element, its transconductance decreases as temperature increases, lowering the slope of the ramp current passing through transistor 58 and increasing the delay in switching. The current source illustrated in FIG. 9 overcomes this problem and compensates for process variations in N-channel transconductance by providing a first P-channel MOS transistor 66, a second P-channel MOS transistor 68 having its gate and drain shorted in a diode configuration, a third P-channel MOS transistor 69, a first N-channel MOS transistor 70 having its gate and drain shorted in a diode configuration, a second N-channel MOS transistor 72 having its gate connected to the gate of transistor 70, and a degenerative resistor 74 placed between the sources of transistors 70 and 72. The drain of the first P-channel MOS transistor 66 is connected to the drain of the first N-channel MOS transistor 70, and the drain of the second P-channel MOS transistor 68 is connected to the drain of the second N-channel MOS transistor 72. The gates of the first P-channel MOS transistor 66, the second P-channel MOS transistor 68 are also connected, as are the gates of the first N-channel MOS transistor 70 and the second N-channel MOS transistor 72. The third P-channel MOS transistor 69 has a gate connected to the gate and drain of the second P-channel MOS transistor 68, a source connected to $V_{DD}$ and a drain connected to the gate of transistor 58. The sources of the first, second and third P-channel MOS transistors are connected to the power supply voltage. The degenerative resistor 74 consists of a heavily doped semiconductor material which exhibits a very low temperature coefficient. Although this circuit is in itself known, its use to generate the bias current in the practice of the invention is an important aspect of the invention, because it reduces the sensitivity to process variables, i.e. N-channel transconductance, and to operating conditions, i.e. power supply and temperature variations.

Because transistors 70 and 72 are formed on the same chip as transistor 58, their variations in parameters due to processing are substantially the same. Transistors 66 and 68 form a balanced current mirror in that they have the same channel width to length ratio (W/L). Transistors 70 and 72 are imbalanced current mirrors in that the channel width to length ratio of the latter is larger than that of the former, e.g. by a multiple of four. The unity gain feedback provided by this circuit constrains the current through transistors 66 and 70 to be the same as the current through transistors 68 and 72. Transistor 69 is also designed to function as a current mirror with transistor 68, i.e. transistor 69 may have the same channel width to length ratio as transistors 66 and 68. As a result, the same current passing through transistors 68 and 72 also passed through transistor 69 and charges capacitor 38 when the output driver is activated. Thus, the bias current supplied by transistor 69 to capacitor 38 is inversely related to the resistance of resistor 74, the transconductance of N-channel transistors 70 and 72, and the channel width to length ratio of N-channel transistors 70 and 72. When the chip to chip process variations are such that the transconductance of transistor 58 is relatively large, the bias current supplied by transistor 69 is relatively small, and visa versa, with the result that the slope of the discharge current $I_G$ remains approximately constant over the prescribed range of N-channel transconductance of the chip. In other words, the bias circuit senses variations in N-channel transconductance of the chip and changes the bias current to compensate for such variations. Selection of the described bias circuit also desensitizes the slope of the discharge circuit $I_G$ to variations in power supply voltage $V_{DD}$.

The transconductance of imbalanced transistors 70 and 72 also tracks changes in the transconductance of the transistor 58 over temperature. The imbalanced transistors produce an imbalanced voltage across the degenerative resistor 74. The transconductance of the imbalanced transistors 70 and 72 decreases with increasing temperature, causing an increasingly imbalanced voltage across the degenerative resistor 74 as temperature increases. As the voltage across the degenerative resistor 74 increases at higher temperatures, more current is supplied to the capacitor 38 to increase the slope of the ramp voltage per unit time applied to the gate of transistor 58, thereby increasing the slope of the ramp of the current at terminal 23 and decreasing the delay caused by the temperature increase. By replacing the current source 34 of FIG. 5 with the current source illustrated in FIG. 9, a positive temperature coefficient is created in the current used to charge the capacitance 38. The capacitance 38 thus charges at an increasing rate as temperature increases, biasing the transistor 58 to conduct a ramp current which is stabilized over a large temperature range. In summary degenerative resistor 74 and transistors 66, 68, 70 and 72 compensate for the effect of temperature changes upon the transconductance of transistor 58 so that the ramp current passing through transistor 58 during discharge of load capacitance 28 maintains an approximately constant slope over a large temperature range.

As may be easily comprehended by reference to FIG. 9, by varying only the channel width over the channel length (W/L) of the third P-channel MOS transistor 69, a faster or slower switching speed may be attained for the same value of package inductance and/or load capacitance. For example, if a fast switching speed is required, a large W/L may be chosen, increasing the slope to the ramp illustrated in FIG. 6, thereby increasing the speed of switching. Alternately, a small W/L may be chosen, decreasing the slope of the ramp illustrated in FIG. 6, and thereby correspondingly decreasing the speed of switching. Similarly, the same switching speed may be attained for either larger or smaller values of load capacitance being driven by respectively increasing or decreasing the value of W/L for the third P-channel MOS transistor 69. Therefore, the geometric design of the output driver need not change for different applications. If in the specific application a smaller package inductance occurs, but the switching delay must be reduced, then the design only requires increasing the W/L of the third P-channel MOS transistor 69.

A third refinement of the present invention provides clamping circuitry for further maintaining a low level of noise during activation of the output driver. As the output voltage $V_{OUT}$ illustrated in FIG. 5 of the output driver 20 decreases during discharge of the load capacitance 28, the transconductance of the transistor 58 decreases, regardless of the particular device utilized as the transconductance device. If the transconductance decreases, the discharge current level $I_G$ decreases dramatically. As a result, the rate of change of the current, which is the derivative of the current, may form a negative spike 82, as illustrated in FIG. 6. The negative spike 82 corresponds to a low voltage signal and is therefore a valid binary logic zero. The negative spike 82, however, may forward bias the isolation diffusion or substrate of the inputs of the other electronic devices being driven by the output driver, leading to latch-up and/or improper operation of the other electronic devices being driven.

The clamp 83 illustrated in FIG. 9 is designed to change the net current through the package inductance 22 when the rate of change of the current $I_G$ changes, thereby suppressing, i.e. reducing the magnitude of the voltage spike across package inductance 22. The clamp 83 is composed of a current source having a P-channel transistor 84, and an N-channel transistor 90 with its gate and drain connected in a diode configuration and an N-channel MOS transistor 92. A first P-channel transistor 86 with gate and drain connected in a diode configuration, a second P-channel transistor 88, a resistor 94 and a capacitor 96 are also provided. The current source, the transistor 86, the resistor 94 and the capacitor 96 cooperate to generate a precision gate voltage for the transistor 88 and a steady state charge across the capacitor 96. When the rate of change of current $I_G$ starts to go negative, capacitor 96 charges. The resulting current temporarily increases the source to gate voltage of the transistor 88 and the current $I_3$ passing through transistor 88 and package inductance 22 to ground. The increase in the current $I_3$ offsets at least in part the decrease in the current $I_G$ and therefore suppresses the negative voltage spike 82. With reference to FIG. 6, clamp 83 thus suppresses negative voltage spike 82 and thereby reduces the likelihood of latch-up of the other electronic devices being driven by the output driver.

During the transition interval, clamp 83 also serves to partially offset increases in the current $I_G$. Specifically, when the rate of change of current $I_G$ starts to go positive, capacitor 96 discharges and the source to gate voltage of transistor 88 temporarily decreases. As a result, the current $I_3$ decreases to offset the increase in the current $I_G$. Thus, clamp 83 suppresses positive voltage spikes as well, until such time as transistor 88 turns off.

In summary, the transistor 88 functions as part of a negative feedback loop that supplies to package inductance 22 a bias current $I_3$. When the current $I_G$ changes, a voltage is generated across the package inductance 22 which changes the charge on and voltage across capacitor 96. This in turn changes the bias current $I_3$. The bias current $I_3$ thus varies according to the rate of change of the discharge current $I_G$ so as to suppress voltage spikes that would otherwise be induced across package inductance 22.

Utilization of the transistor 56 in FIG. 9 as the switch may lead to excessive power consumption. More specifically, before the output driver is activated, the transistor 56 must be conductive in order to maintain the terminals of the capacitor 38 shorted. By maintaining transistor 56 conductive, a path is provided through which current from the power supply may continuously pass. Moreover, if the output driver is complementary, then transistor 56 or its complement will always be conductive, consuming current from the power supply. In view of the large number of output drivers which are utilized within many integrated circuits, the total power consumption may potentially be quite large.

Figure 10:
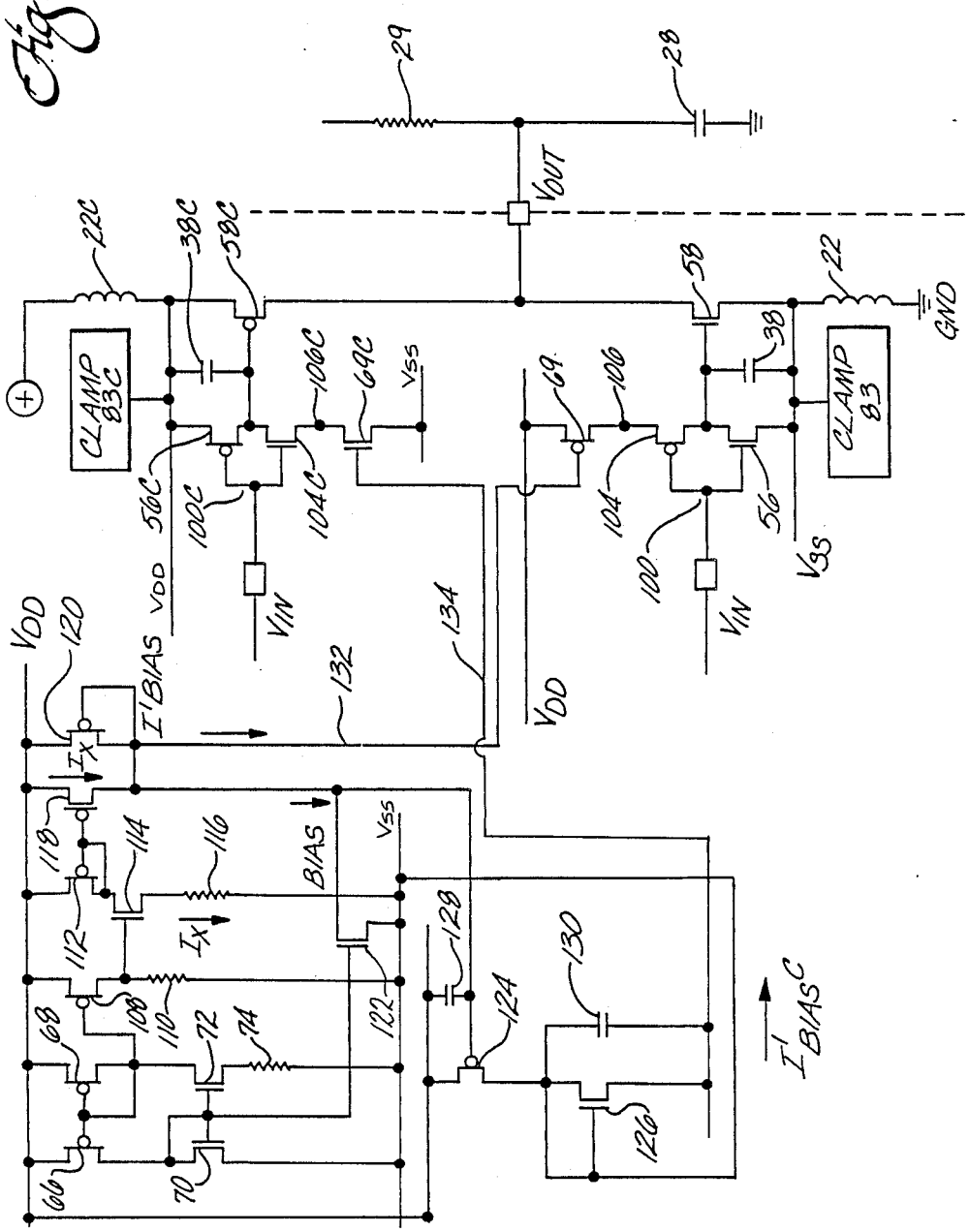
FIG. 10 is a schematic circuit diagram of an output driver channel applying the principals of the invention to reduce transient noise due to package inductance associated with two power supply connections.

FIG. 10 illustrates an alternate embodiment of the output driver of the present invention which overcomes the disadvantages of utilizing the transistor 56 alone as the switch of FIG. 9. In FIG. 10, a P-channel transistor 104 has been connected to the N-channel transistor 56 to form a full CMOS ratioed complementary inverter pair 100. The source of the transistor 104 is connected to the drain of transistor 69, and the input voltage $V_{IN}$ of the output driver applied to the gates of both transistors 56 and 104. The drains of the transistors 56 and 104 are connected to one another and to the gate of transistor 58.

Prior to activation of the output driver of FIG. 10, the input voltage $V_{IN}$ is high. The N-channel transistor 56 is therefore conductive, the opposing terminals of the capacitor 38 are shorted, and the gate of the transistor 58 is low, as desired. The P-channel transistor 104 is nonconductive, however. As a result, the current path through the transistor 56 is eliminated. Power consumption is thereby reduced during the time period prior to activation of the output driver.

As a result of placing the transistor 104 between the P-channel transistor 69 and the transistor 56 to reduce power consumption, a charge Q may develop at a node 106 when the transistor 104 is nonconductive. When the transistor 104 later becomes conductive during activation of the output driver, the charge Q transfers towards the gate of transistor 58. A nonlinear increase in voltage may therefore occur at the gate of the transistor 58. Since it is an object of the present invention to provide a linearly increasing voltage $V_G$ to transistor 58 such that it may operate as a transconductance element to output a linearly increasing output current to the inductance 22, it is desirable to minimize the effect of the momentary increase in gate voltage $V_G$ on the transistor 58. Depending upon a number of factors, the gate voltage $V_G$ of transistor 58 may increase in one of a number of manners as a result of the transfer of the charge Q. In the worst case scenario, the transistor 104 becomes conductive very quickly and the transistor 56 becomes nonconductive very quickly when the input voltage $V_{IN}$ goes low. As a result, the gate voltage $V_G$ of the transistor 58 rises as a step function to the point A as much of the charge Q is transferred to the gate of the transistor 58, as illustrated by portion 11A of curve 11. The maximum value of the voltage attained at the point A is determined by the relative ratio of the parasitic capacitance $C_{106}$ of the node 106 to the sum of the parasitic capacitance $C_{58}$ of the gate of transistor 58 and the integrated capacitance $C_{38}$ of capacitor 38. As illustrated for the curve 11, once the charge Q is distributed equally between the node 106 and the gate of transistor 58, the gate voltage $V_G$ of transistor 58 transforms into a linearly increasing function represented by the portion of the curve 11B as the capacitor 38 becomes charged by the current from the current source.

Since transistor 58 operates as a transconductance element only when its gate voltage is higher than its threshold voltage $V_T$, the effect of the step-like increase in the gate voltage $V_G$ will be minimal if the gate voltage $V_G$ at point A does not rise above the level of the threshold voltage $V_T$ of the transistor 58. Maintaining the gate voltage $V_G$ of transistor 58 below the threshold voltage $V_T$ as the inverter is switched may be accomplished by selecting an appropriate value for the ratio $C_{106}/(C_{38}+C_{58})$, which, as previously stated, controls the highest voltage level at point A of the step function. Moreover, the delay due to the time required to make transistor 58 conductive may also be minimized by selecting an appropriate value of this ratio since a maximum gate voltage at point A may be selected which is only slightly below the threshold voltage $V_T$ of transistor 58. When current from the current source then begins to charge the capacitor 38, the transistor 58 will almost instantaneously commence to operate as a transconductive element. As a result, a negligible delay similar to that attainable by the output driver of FIG. 9 may be realized without the necessity of utilizing die area to accommodate the inverter 62 and the capacitor 64 of FIG. 9. In other words, the parasitic capacitance $C_{106}$ performs the function of capacitor 64 in FIG. 9.

As with the output driver of FIG. 9, the output driver of FIG. 10 may also incorporate the clamp 83 illustrated in FIG. 9.

The output driver of FIG. 10 also provides additional refinements to the current source of FIG. 9 which may also be used in the output driver of FIG. 9. As previously stated, the current source illustrated in FIG. 9 utilizes a degenerative resistor 74 consisting of a heavily doped semiconductor material which exhibits a very low temperature coefficient. Unfortunately, the resistance value of the degenerative resistor 74 may vary significantly with manufacturing process variations. If the resistance value of the degenerative resistor 74 falls too far below its designed value, an excess voltage may be developed across the degenerative resistor 74, resulting in the supply of excess bias current to the transistor 58, fast switching of the output driver and the possible generation of excessive switching noise. The modifications shown in FIG. 10 provide a means for accommodating these process variations by sensing the actual voltage across the degenerative resistor 74. If the actual voltage level is significantly higher than the designed voltage value, the accommodating means tends to reduce the bias current supplied to the capacitor 38 to the originally designed bias current value.

The modified current source illustrated in FIG. 10 includes a P-channel MOS transistor 108 having its gate connected to the gates of transistors 66 and 68 and its source connected to the power supply. A resistance element 110 is provided having one terminal grounded and its other terminal connected to the drain of transistor 108. A second P-channel MOS transistor 112 is provided having its source connected to the power supply and its drain connected to both its gate and the drain of an N-channel MOS transistor 114. The gate of transistor 114 is connected to the drain of the transistor 108 and its source is connected to a grounded resistor 116. A third P-channel MOS transistor 118 has its source connected to the power supply and its gate connected to the gate of the transistor 112 in a current mirror configuration. A fourth P-channel MOS transistor 120 has its gate and drain connected in a diode configuration. The drains of transistor 118 and 120 are connected to the gate of transistor 69. A second N-channel MOS transistor 122 is also provided, with its source grounded, its drain connected to the drain of transistors 118 and 120, and its gate connected to the gates of transistors 70 and 72.

The current level $I_{BIAS}$ passing through the transistor 122 corresponds to the current $I_{BIAS}$ passing through the transistor 69 in FIG. 9. Assuming that the value of the resistance of the degenerative resistor 74 may be lower than a specified value due to process variations, the actual value of the current $I_{BIAS}$ passing through the transistor 122 may have a level which is much higher than the desired. In such a case, the modified current source of FIG. 10 tends to reduce the current $I_{BIAS}$ by an amount $I_X$ to produce a new current level $I_{BIAS}'$ formed by the P-channel transistors 69 and 120 of FIG. 10 which is supplied to the current mirror structure of transistor 69 of FIG. 10. The amount of the current reduction $I_X$ is determined in the following manner.

The current passing through the degenerative resistor 74 is duplicated by the transistor 108 by the current mirror configuration formed with the transistor 68. The duplicated current passes through the resistor 110 to develop an amplified voltage across the resistor 110 which is equal to the voltage produced across the degenerative resistor 74 multiplied by the ratio of the resistance of resistor 110 over the resistance of the resistor 74. The amplified voltage across the resistor 110 is applied to the gate of the transistor 114. The ratio of the channel width over the channel length (W/L) of the transistor 114, in conjunction with the resistance of the resistor 116, operate to develop a current $I_X$ of a selected value which is passed through transistor 112 in response to the amplified voltage across the resistor 110. The current mirror transistors 112 and 118 subtract the selected current level $I_X$ from the current level $I_{BIAS}$ passing through the transistor 122, resulting in $I'_{BIAS}$ passing through device 120. The transistors 118, 112 and 122 thus form a current mirror subtractor with transistor 120 such that a new current level $I'_{BIAS}$ is developed which has a value equal to the value of the current $I_{BIAS}$ minus the value of the current $I_X$. Since the P-channel transistors 69 and 120 are in a current mirror configuration, the transistor 69 produces a duplicate of the current $I'_{BIAS}$ which passes through the diode connected transistor 120.

In FIG. 10, charging circuit 24 takes the form of a full complement of the described discharging circuit in order to reduce transient noise voltage on the low to high voltage transitions due to a package inductance 22C. This includes a complementary capacitor 38C, complementary transistors 56C, 58C, 69C, 104C, a node 106C and a complementary clamp 83C. Inductance 22C represents the parasitic inductance of the conductive path, including package lead, from $V_{DD}$ on the integrated circuit chip on which the output driver is formed to the system positive power supply voltage bus on the printed circuit board. Additional circuitry may also be provided for generating the complement of the bias current $I'_{BIAS}$ for the complementary output driver. The additional circuitry may include, for example, a P-channel MOS transistor 124 having its gate connected to the gate of transistor 120 and its source connected to the power supply. An N-channel MOS transistor 126 is provided having a grounded source and its gate connected to both its drain and the drain of transistor 124. A complementary bias line 134 may also be provided through which the complementary bias current $I'_{BIAS}C$ may pass to the complementary transistor 69C. Capacitors 128 and 130 are optionally provided to make bias line 132 and complementary bias line 134 immune to minor levels of noise.

Figure 12:
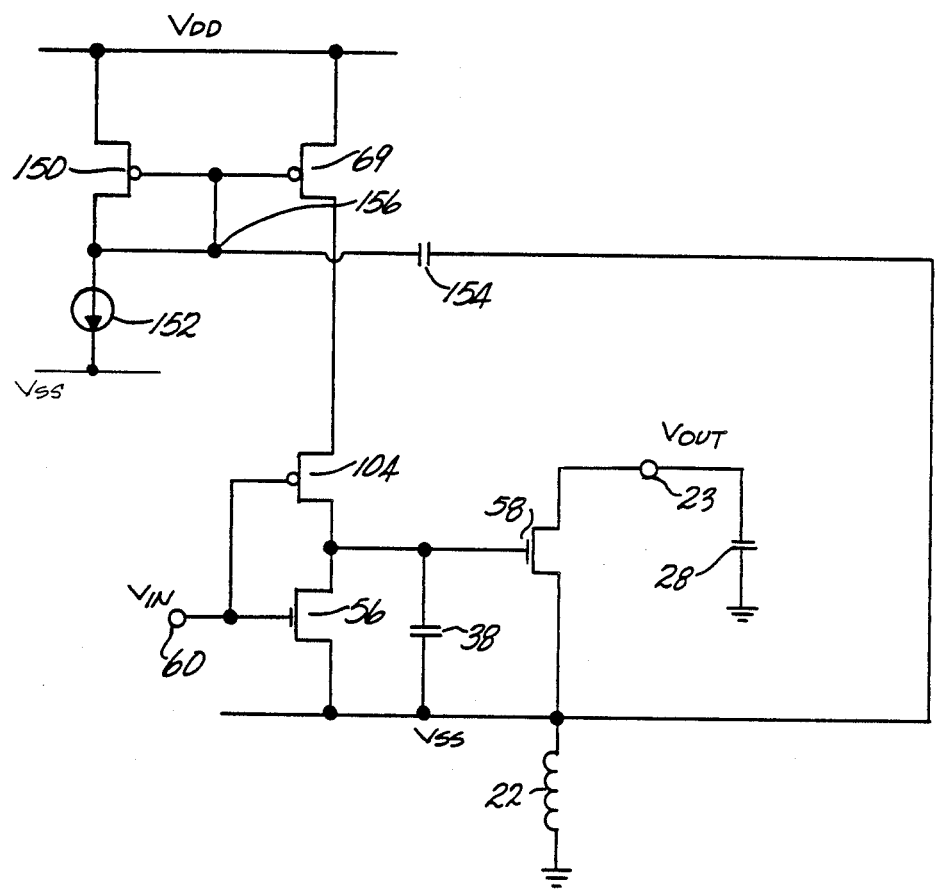
FIG. 12 is a schematic circuit diagram of an output driver channel illustrating negative feedback to suppress transient noise.

FIG. 12 is a simplified version of FIG. 10. The clamping circuitry is not shown. Neither is charging circuit 24. The bias source is represented by a P-channel MOS transistor 150 and a current source 152. Power supply voltage $V_{DD}$ is applied to the source of transistor 150. Current source 152 is connected from 35 the gate and drain of transistor 150 to $V_{SS}$. The gate of transistor 150 is connected to the gate of transistor 69. The gate and drain of transistor 150 are connected in a diode configuration. An important refinement of this embodiment is a negative feedback connection from $V_{SS}$ through a capacitor 154 to a bias node 156 at the junction of the drain and gate of transistor 150 and the gate of transistor 69. Transistor 150 and current source 152 provide a Voltage bias at node 156. The value of this voltage bias is changed by the negative feedback applied to node 156 through capacitor 154. Transient noise voltage induced across package inductance 22 by the current discharged from load capacitance 28 during a high to low input voltage transition gives rise to a current that is fed back through capacitor 154 which in turn reduces the net bias current of transistor 150. As a result, when the additive effect of the switching of many output driver channels during a transition interval increases the transient noise voltage, the charging current of capacitor 38 decreases and the rate of discharge current $I_G$ from load capacitance 28 through transistor 58 and package inductance 22 also decreases. In short, the connection through capacitor 154 provides negative feedback that suppresses the transient noise voltage across package inductance 22. In this embodiment, a common, i.e. single, feedback connection serves all the output driver stages connected to the same ground package lead and the change in gate voltage for transistor 69 due to the feedback current is produced by the high impedance of the current source 152 and diode connected transistor 150. Capacitor 154 serves to block direct current coupling between $V_{SS}$ and node 156, and to provide a predetermined displacement current to the bias node.

Figure 13:
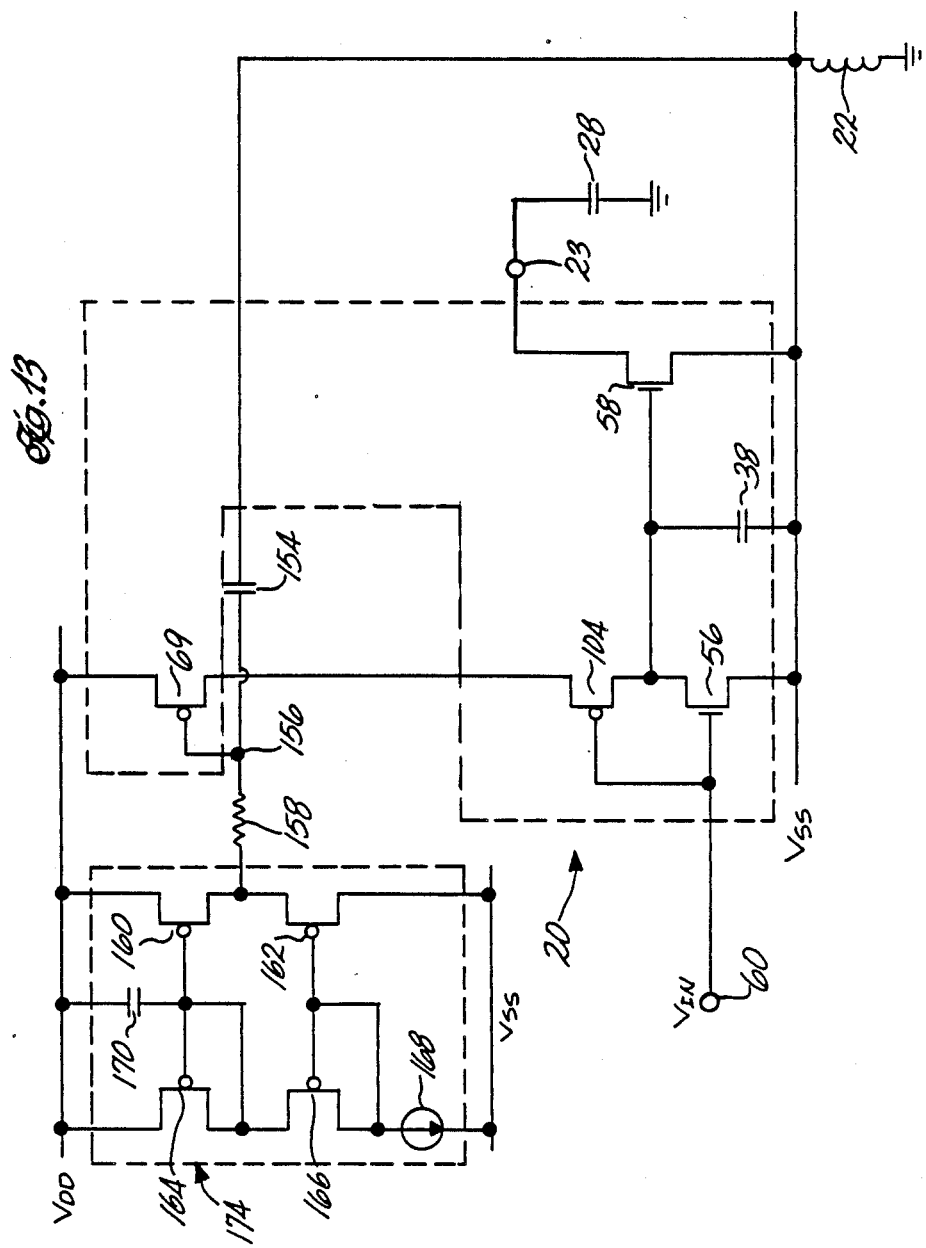
FIG. 13 is a schematic circuit diagram of another embodiment of an output driver channel illustrating negative feedback to suppress transient noise.

In FIG. 13 a bias coupling resistor 158 individual to the illustrated output driver channel is connected in series with a capacitor 154 individual to the illustrated output driver channel. Bias node 156, which is formed at the junction of capacitor 154 and resistor 158, is connected to the gate of transistor 69. P-channel MOS transistors 160, 162, 164 and 166, and a current source 168 serve as a common voltage bias source for all the local driver channels. Power supply voltage $V_{DD}$ is applied to the sources of transistors 160 and 164. The drains of transistors 160 and 164 are connected to the sources of transistors 162 and 166, respectively. Current source 168 is connected from the drain of transistor 166 to $V_{SS}$. The drain of transistor 162 is connected to $V_{SS}$. The gates of transistors 160 and 164 are connected together; the gates of transistors 162 and 166 are connected together; the drain and gate of transistor 166 are connected together; and the drain and gate of transistor 164 are connected together in a diode configuration. A capacitor 170 connected between power supply $V_{DD}$ and the gates of transistors 160 and 164 serves to reduce the effect of switching noise in disturbing the bias current of transistors 160 and 162.

Figure 14:
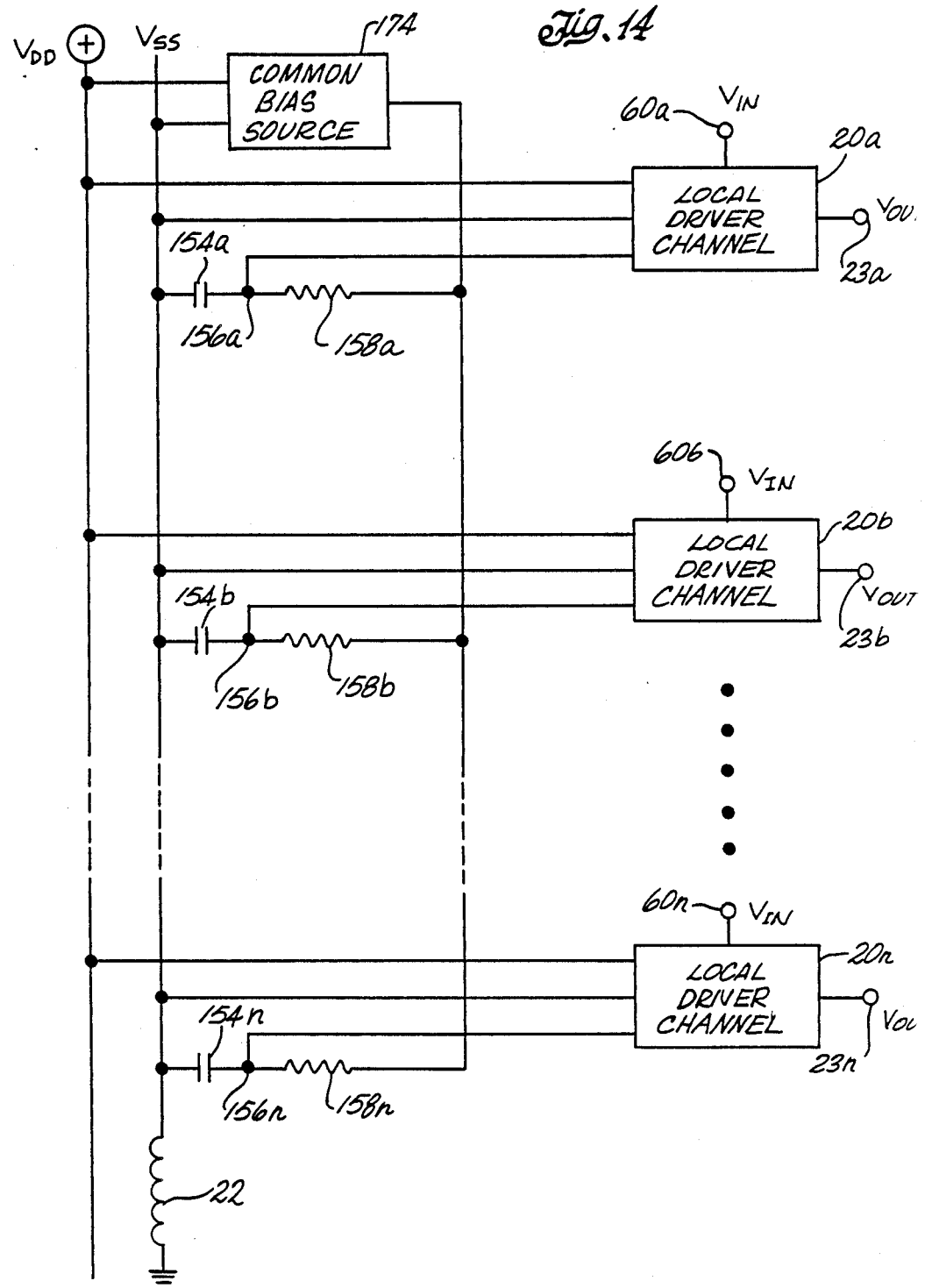
FIG. 14 is a schematic, partially block diagram of the embodiment of FIG. 13 for a plurality of output driver channels.

The circuitry within a broken line box 20 comprises one of a number of output driver channels in the integrated circuit chip connected to the same package ground lead. The circuitry within a broken line box 174 serves as the common voltage bias source in the integrated circuit chip connected to the same package power supply and ground leads. A plurality of bias coupling resistors such as that designated 158 connect the common bias source 174 to the respective output driver channels. This is depicted in FIG. 14. A common bias source 174 which is the same as bias source 174 in FIG. 13, is connected by resistors 158a, 158b, . . . 158n to output driver channels 20a, 20b, . . . 20n, respectively, which are the same as driver channel 20 in FIG. 13. The binary signals to be carried "off chip" are applied to input terminals 60a, 60b, . . . 60n of driver channels 20a, 20b, . . . 20n, and output terminals 23a, 23b, . . . 23n are connected to the output data package leads of the integrated circuit. Power supply voltage $V_{DD}$ is applied to common bias source 174 and each of output driver channels 20a, 20b, . . . 20n. Similarly, the local ground on the chip $V_{SS}$ is connected to common bias source 174 and each of output driver channels 20a, 20b, . . . 20n. The connection of $V_{SS}$ to the system ground (GND) through the ground package lead of the integrated circuit gives rise to parasitic package inductance 22. Common bias source 174 establishes at bias nodes 156a, 156b, . . . 156n for output driver channels 20a, 20b, . . . 20n, respectively, bias voltages that establish the level of the constant charging current passing through transistors 69 and 104 when the driver circuit is actuated. Feedback capacitors 154a, 154b, . . . 154n are connected from package inductance 22 to nodes 156a, 156b, . . . 156n, respectively. Because of the low impedance at the junction of transistors 160 and 162, resistance must be provided between such junction and node 156 in order to generate the gate voltage for transistor 69 due to the feedback current. If a single capacitor 154 and resistor were employed as in the embodiment of FIG. 12, the size of the capacitance and resistance required to feedback the gate voltage for transistor 69 depends on the number of output drivers, because the parasitic capacitance from $V_{DD}$ to node 156 increases as the number of drivers increases. This time constant is somewhat critical. An excessive time constant produces a prolonged disturbance in the bias voltage, possibly causing excessive delay in the output drivers. An insufficient time constant may produce inadequate displacement current to produce the required momentary shift in bias voltage. By providing individual negative feedback connections to output driver channels 20a, 20b, . . . 20n, the time constant of the feedback connection in essence occurs within the various output driver channels and R 158 and C 154 no longer depend on the number of output drivers used.

Upon first blush, it might appear that this negative feedback would delay the operation of the output drivers such that the transition interval and thus the bit period would have to be increased. Such is not the case however. In the fabrication of integrated circuit chips, there are process variables that cause some chips to have transistors that switch faster than other chips. The chips on which the faster switching transistors are formed generate more transient noise voltage at the output drivers than those on which the slower switching transistors are formed. The faster transistors are delayed more by the feedback than the slower transistors because the former generate more noise. Preferably, the feedback factor is selected so the transition interval of the faster and slower transistors is about the same for worst case noise conditions, e.g. about 40 ns. This gives the most noise suppression without requiring a longer transition interval.

Figure 15:
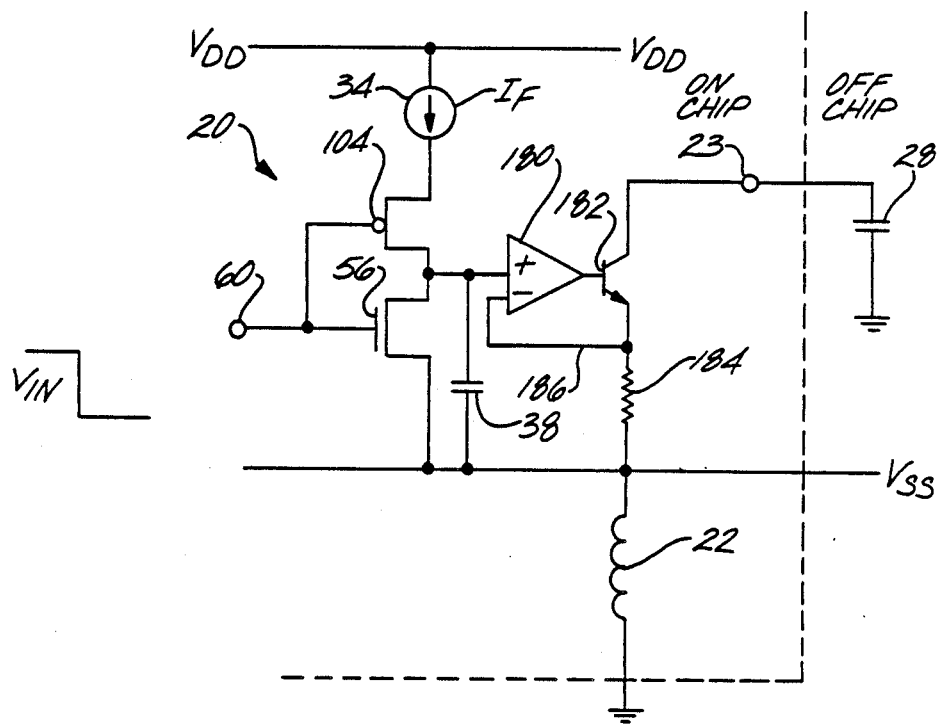
FIG. 15 is a schematic circuit diagram of an alternative output driver stage incorporating principles of the invention.

The invention is applicable to output driver stages employing devices other than MOS transistors. For example, as illustrated in FIG. 15, an output driver stage could comprise an operational amplifier formed by a difference amplifier 180, a bipolar transistor 182, an emitter follower resistor 184, and a feedback connection 186. The junction of the drain of transistor 56 and source of transistor 104 comprises the input to the driver stage, which is connected to the positive input of amplifier 180. The output of amplifier 180 is connected to the base of transistor 182. The collector of transistor 182 is connected to output terminal 23. The emitter of transistor 182 is coupled by feedback connection 186 to the negative input of amplifier 180 and by resistor 184 to $V_{SS}$. The described operational amplifier performs the same switching and transconductance functions of MOS transistor 58 in the previously described embodiments. Assuming that resistor 184 does not have a significant temperature coefficient, the bias circuit in this case would comprise a fixed current source over temperature since the transconductance is inversely proportional to the resistance of resistor 184. Alternatively, an MOS transistor could be employed in the operational amplifier instead of bipolar transistor 182, or the output driver stage could comprise an emitter follower bipolar transistor stage or a grounded emitter bipolar transistor stage.

Figure 16:
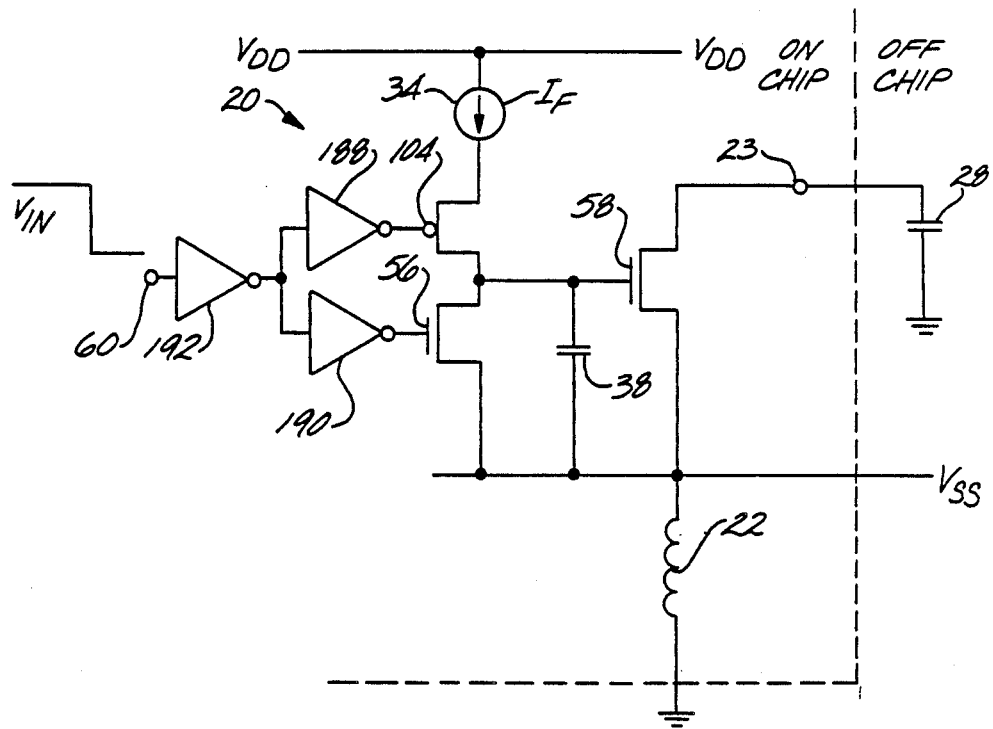
FIG. 16 is a schematic circuit diagram of an alternative predriver for an output driver channel incorporating the principals of the invention.

Because of variations in process of the integrated circuit chip and in operating conditions, it is possible that transistor 104 will turn on before transistor 56 turns off, which causes loss of charge on capacitor 38 and thus increases the switching delay and which increases the transient noise due to package inductance. To eliminate this possibility, in FIG 16 inverters 188 and 190 (e.g. each a ratioed CMOS inverter) are connected between input terminal 60 and the gate of transistor 104 and the gate of transistor 56, respectively. The W/L ratio of inverter 188 is designed to be sufficiently small relative to that of inverter 190 to insure that transistor 56 turns off before transistor 104 turns on. To account for the inversion, another inverter 192 (e.g. N-channel MOS transistor) connects input terminal 60 to the inputs of inverters 188 and 190.

Figure 11:
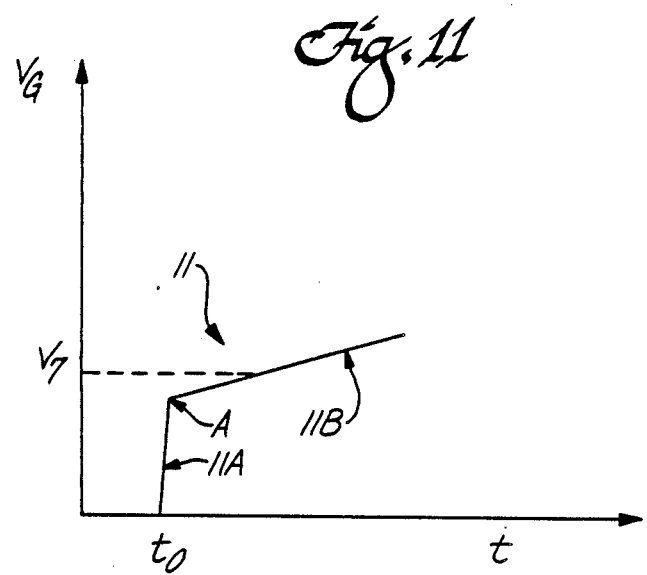
FIG. 11 is a wave form illustrating the operation of part of FIG. 10.
Figure 17:
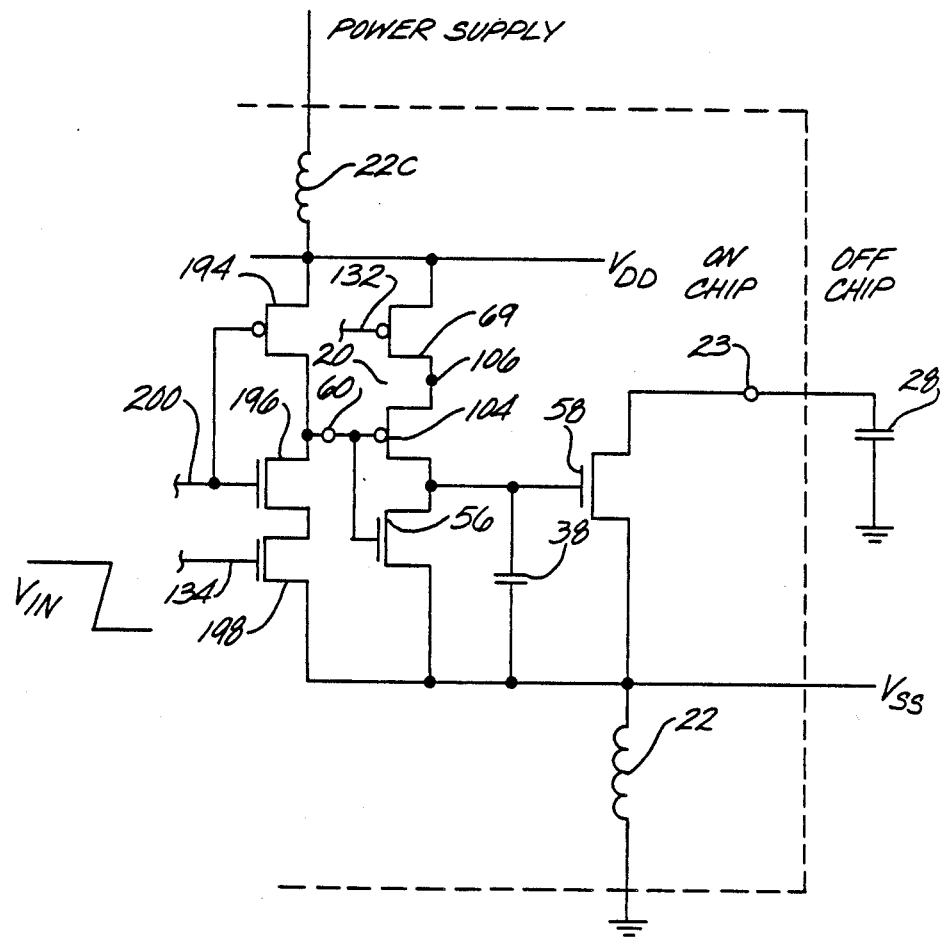
FIG. 17 is a schematic circuit diagram of another alternative predriver for an output driver channel incorporating principals of the invention.

As discussed above in connection with FIGS. 10 and 11, a parasitic capacitance is formed at the node 106. Upon the application of a step voltage to the gates of transistors 104 and 56 at the start of a high to low transition interval, the charge stored at node 106 is redistributed vis-a-vis capacitor 38, which gives rise to a change in current through the package inductance 22C. This dI/dt results from the saturated current source 69 becoming active when the voltage at node 106 decreases as the charge of node 106 is redistributed. This causes a transient noise voltage at $V_{DD}$ which is capacitively coupled to $V_{SS}$. In summary, the uncontrolled rapid discharge of the capacitance at node 106 at the beginning of a high to low transition contributes to the transient noise voltage appearing at $V_{SS}$ during the high to low transition interval. In FIG. 17, P-channel transistor 194 and an N-channel transistor 196 comprise a CMOS logic element, i.e. an inverter, that feeds the output driver 20. Instead of an inverter, other CMOS logic elements such as a NOR circuit or a NAND circuit could be employed. An additional N-channel transistor 198 provides a bias current to control the discharge of the capacitance of node 106. $V_{DD}$ is applied to the source of transistor 194. The drain of transistor 194 and the drain of transistor 196 are connected to the input terminal 60. The source of transistor 196 is connected to the drain of transistor 198. $V_{SS}$ is applied to the source of transistor 198. Bias line 134 (see FIG. 10) is connected to the gate of transistor 198. A data line 200 at one of two binary voltage levels is connected to the gates of transistors 194 and 196. When line 200 transitions from low to high, the voltage at input terminal 60, $V_{IN}$, transitions from high to low thereby discharging capacitance 28 in the manner described above. At the beginning of this process, transistor 198 controls the discharge current from node 106 through transistor 104 to be an increasing ramp-like current so as to provide an increase in the gate voltage on transistor 58 to point A (see FIG. 11) in a curved path rather than as a step function. For a typical application, transistor 198 would slow the rise time of the current discharge from node 106 from less than 1 ns to approximately 3 ns. In other words, transistor 198 serves to control the discharge current from node 106 in a fashion analogous to the control of the discharge current from output capacitance 28 by transistor 58, although only during a small portion of the transition interval. The voltage coupled to the gate of transistor 198 by bias line 134 serves to compensate for changes in P-channel transconductance analogous to the N-channel compensation provided to the gate of transistor 69 by bias line 132. Preferably, the output driver is designed so the controlling effect of transistor 198 occurs prior to the time that transistor 58 reaches its threshold $V_T$ so it does not influence the slope of the discharge current flowing through package inductance 22.

The described embodiments of the invention are only considered to be preferred and illustrative of the inventive concept; the scope of the invention is not to be restricted to such embodiments. Various and numerous other arrangements may be devised by one skilled in the art without departing from the spirit and scope of this invention.

What is claimed is:

1. A circuit for reducing the level of transient noise generated during switching at the output of an integrated circuit that drives a capacitive load, the circuit comprising:
   output driver switch means turned on and off to charge and discharge the load to one of two binary voltage levels;
   a package inductance in circuit between the load and a power supply potential external to the integrated circuit; and
   means for controlling the current through the package inductance during operation of the switch means in ramp shaped fashion for the entire transition interval from one binary level to the other, in which the switch means and controlling means comprise a transconductance device having end terminals connected between the capacitive load and the package inductance, an input terminal responsive to voltage which controls the current through the transconductance device, a capacitor connected across the input terminal and one of the end terminals of the transconductance device, and a fixed current source for charging the capacitor.

2. The circuit of claim 1, in which the external power supply potential is ground potential, the package inductance is in circuit between the load and the external ground potential, the load is charged to a high voltage level and discharged to a low voltage level near the external ground potential and the current is controlled in ramp shaped fashion for the entire transition interval from the high level to the low level.

3. The circuit of claim 2, additionally comprising:
a positive power supply potential external to the integrated circuit near which the load is charged by the output driver switch means to the high level;
another package inductance in circuit between the load and the external positive potential; and
means for controlling the current through the other package inductance during operation of the switching means in ramp shaped fashion for the entire transition interval from the low level to the high level.

4. The circuit of claim 1, in which the external power supply potential is positive potential, the package inductance is in circuit between the load and the external positive potential, the load is charged to a high voltage level near the external positive potential and discharged to a low voltage level and the current is controlled in ramp shaped fashion for the entire transition interval from the low level to the high level.

5. The circuit of claim 1, additionally comprising means for feeding back the voltage across the package inductance to the current source to change the amplitude of the current charging the capacitor in inverse relationship to the voltage across the package inductance.

6. The circuit of claim 1, additionally comprising means for sensing changes in transconductance of the transconductance device and means responsive to the sensing means for adjusting the value of the fixed current in inverse relationship to sensed transconductance changes.

7. The circuit of claim 1, additionally comprising means for sensing changes in temperature of the circuit and means responsive to the sensing means for adjusting the fixed current in direct relationship to sensed temperature changes.

8. The circuit of claim 1, additionally comprising means for increasing the value of the fixed current as the transconductance of the transconductance device decreases and visa versa.

9. The circuit of claim 1, additionally comprising means for sensing changes in voltage across the package inductance and means responsive to the sensing means for adjusting the fixed current in inverse relationship to the sensed voltage.

10. The circuit of claim 1 configured as an integrated circuit having sheet resistivity, additionally comprising means for sensing the sheet resistivity of the circuit and means for limiting the value of the fixed current responsive to the sensing means.

11. The circuit of claim 7, in which the feeding back means comprises a capacitor.

12. The circuit of claim 1, in which the slope of the current remains approximately constant during the transition interval.

13. The circuit of claim 1, additionally comprising means for supplying a clamping bias current to the package inductance and means responsive to changes in the current passing through the package inductance to adjust the clamping bias current to oppose such change.

14. An integrated circuit package comprising:
a plurality of data output package leads;
a ground package lead;
an integrated circuit chip having a plurality of binary output driver channels connected between the respective data output leads and the ground lead;
means for selectively switching the driver channels on and off;
means for maintaining an approximately linear change in current through the channels as they are switched; and
a conductive path from the driver channels to the ground package lead; and
feedback means for decreasing the linear change in current as the voltage across the conductive path increases and visa versa.

15. The integrated circuit package of claim 14, in which the driver channels each comprise a transconductance device having end terminals connected between the corresponding data output lead and the ground lead and a gate terminal, and the maintaining means each comprise a capacitor connected across each gate terminal and one of the end terminals, a common fixed current source, and means for individually coupling the source to the capacitors to charge the capacitors and to switch on selective driver channels.

16. An output driver circuit comprising:
an input circuit;
a capacitive load;
a source of first power supply potential;
a source of second power supply potential different from the first potential;
means responsive to a change from a first binary input level to a second binary input level across the input circuit for switching the load from the second potential to the first potential;
a transconductance device having an input terminal, an output terminal connected to the load, and a common terminal connected through an inductance to the source of second potential;
a capacitance connected between the input terminal and the common terminal;
a fixed current source;
switching means responsive to a change from the second binary input level to the first binary input level across the input circuit for connecting the fixed current source to the capacitance to change the voltage across the capacitance and the current through the load linearly while switching the load from the first potential to the second potential.

17. The output driver circuit of claim 16, in which the transconductance device is an operational amplifier comprising:
a bipolar transistor;
a difference amplifier having an inverting input and a noninverting input;
an emitter following resistor;
means for connecting the output of the difference amplifier to the base of the transistor;
means for connecting the emitter of the transistor to the inverting input of the difference amplifier; and
means for connecting one end of the resistor to the emitter of the transistor, the noninverting input of the difference amplifier being the input terminal, the collector of the transistor being the output terminal, and the other end of the transistor being the common terminal.

18. The output driver circuit of claim 16, in which the transconductance device is a transistor.

19. The output driver circuit of claim 18, in which the transistor is a bipolar transistor having a base as the input terminal, an emitter as the common terminal, and a collector as the output terminal.

20. The output driver circuit of claim 18, in which the transistor is a transconductance MOS transistor of given conductivity gate having a gate as the input terminal, a source as the common terminal, and a drain as the output terminal.

21. The output driver circuit of claim 20, in which the means for changing the load from the second potential to the first potential is another MOS transistor of complementary conductivity type having a gate connected to the input circuit, a source connected through an inductance to the source of first potential, a drain connected to the load, another capacitance connected between the gate and the source, another fixed current source, and another switching means responsive to a change from the first binary input level to the second binary input level across the input circuit for connecting the other fixed current source to the other capacitance to change the voltage across the other capacitance and the current through the load linearly while changing the load from the second potential to the first potential.

22. The output driver circuit of claim 20, in which the fixed current source is a MOS transistor of complementary conductivity type having a source connected to the source of first potential, a drain connected to the gate of the transconductance MOS transistor, and a gate connected to a predetermined bias potential.

23. The output driver circuit of claim 22, additionally comprising means for changing the predetermined bias potential in inverse relationship to the transconductance of the transconductance MOS transistor.

24. The output driver circuit of claim 23, in which the given conductivity type is N-channel and the complementary conductivity type is P-channel.

25. The output driver circuit of claim 20, in which the switching means comprises:
   a first switching MOS transistor of the given conductivity type having a source connected to the source of the transconductance MOS transistor, a drain connected to the gate of the transconductance MOS transistor, and a gate to which the input circuit is connected; and
   a second switching MOS transistor of complementary conductivity type having a source connected to the fixed current source, a drain connected to the gate of the transconductance MOS transistor, and a gate to which the input circuit is connected.

26. The output driver circuit of claim 25, in which the given conductivity type is N-channel and the complementary conductivity type is P-channel.

27. The output driver circuit of claim 25, in which the input circuit comprises a logic circuit having an output directly connected to the gates of both the first and second switching MOS transistors.

28. The output driver circuit of claim 25, in which the input circuit comprises:
   a first CMOS logic element with a given W/L ratio having an output connected to the first switching MOS transistor and an input;
   and a second CMOS logic element with a smaller W/L ratio having an output connected to the second switching MOS transistor and an input directly connected to the input of the first CMOS logic element so the first switching transistor turns off before the second switching transistor turns on.

29. The output driver circuit of claim 25, in which the input circuit comprises:

a CMOS logic element having a first end terminal connected to the source of first potential, a second end terminal, an input terminal, and an output terminal connected to the gates of both the first and second switching MOS transistors;
a MOS transistor of the given conductivity type having a source connected to the source of the transconductance MOS transistor, a drain connected to the second end terminal of the CMOS logic element, and a gate;
a source of bias voltage connected to the gate; and
means for changing the bias voltage to compensate for changes in transconductance of the complementary type.

30. The output driver circuit of claim 23, in which the means for changing the predetermined potential comprises:
   an imbalanced MOS current mirror of the given conductivity type formed on the same chip as the transconductance MOS transistor;
   a balanced MOS current mirror of complementary conductivity type connected to form a feedback loop with the imbalanced current mirror;
   and means for coupling the balanced and imbalanced current mirrors to the gate of the fixed current MOS transistor to form a current mirror therewith.

31. The output driver circuit of claim 30, in which the feedback loop has unity gain.

32. The output driver circuit of claim 31, in which the imbalanced current mirror comprises:
   a first MOS transistor having a source connected to the source of second potential;
   a gate;
   a drain; and
   a degenerative resistor having a low temperature coefficient and a second MOS transistor having a source connected through the resistor to the source of second potential, and a gate connected to the gate and drain of the first MOS transistor, the first and second transistors having different W/L ratios.

33. The output driver circuit of claim 32, in which the resistor is a heavily doped semiconductor material and the balanced current mirror comprises:
   a third MOS transistor having a source connected to the source of first potential, a gate, and a drain connected to the drain of the first transistor; and
   a fourth MOS transistor having
   a source connected to the source of first potential;
   a gate connected to the gate of the third transistor; and
   a drain connected to the drain of the second transistor, the gate of the third transistor, and the gate of the fixed current transistor, the third and fourth transistors having the same W/L ratio as the fixed current MOS transistor.

34. The output driver circuit of claim 16, additionally comprising means for sensing changes in the current through the inductance, means responsive to the sensing means for generating a compensating current, and means for coupling the compensating current to the inductance to oppose the current change through the inductance.

35. The output driver circuit of claim 34, in which the current generating means generates compensating current when the current through the inductance decreases.

36. The output driver circuit of claim 35, in which the current generating means also generates a compensating current when the current through the inductance increases up to a predetermined limit.

37. The output driver circuit of claim 34, in which the sensing means comprises a sensing capacitor, a fixed current source connected to one end of the sensing capacitor, and means for connecting the other end of the capacitor to the common terminal.

38. The output driver circuit of claim 37, in which the current generating means comprises a transconductance device having a first terminal connected to the source of first potential, a second terminal connected to the common terminal, and a control terminal connected to the one end of the sensing capacitor.

39. The output driver circuit of claim 37, in which the fixed current source includes a MOS transistor having a source connected to the source of first potential, a drain connected to the common terminal, and a gate connected to a predetermined potential.

40. The output driver circuit of claim 39, additionally comprising means for changing the predetermined potential in inverse relationship to the transconductance of the MOS transistor.

41. The output driver circuit of claim 20, additionally comprising:
another capacitance;
means for charging the other capacitance responsive to the second binary input level across the input circuit; and
means for transferring part of the charge to the first named capacitance responsive to a change from the second binary input level to the first binary input level across the input circuit instantly to raise the voltage across the input terminal and the common terminal to a value near the threshold voltage of the transconductance device.

42. The output driver circuit of claim 41, in which the charging means comprises an inverter connected between the input circuit and one terminal of the other capacitance and the transferring means comprises a switch having a first end terminal connected to the other terminal of the other capacitance and the input terminal of the transconductance device and a second end terminal connected to the common terminal of the transconductance device, the switch conducting when the input circuit is at the first binary input level.

43. The output driver circuit of claim 41, in which the fixed current source is a MOS transistor of complementary conductivity type having
a source connected to the source of first potential;
a drain connected to the gate of the transconductance MOS transistor; and
a gate connected to a predetermined bias potential, the charging means is a MOS transistor of complementary conductivity type having
a source connected to the drain of the fixed current source transistor;
a gate to which the input circuit is connected; and
a drain connected to the gate of the transconductance MOS transistor, the other capacitance being at least in part the parasitic capacitance between the transistors of complementary conductivity type, and the transferring means is a MOS transistor of the given conductivity type having
a source conducted to the source of second potential;
a gate to which the input circuit is connected; and
a drain connected to the drain of the charging MOS transistor and the gate of the transconductance MOS transistor.

44. The output driver circuit of claim 32, additionally comprising means for sensing the voltage across the degenerative resistor, and means for limiting the predetermined bias potential if the sensed voltage exceeds a designed value.

45. The output driver circuit of claim 44, in which the limiting means comprises a current mirror subtractor connected to the balanced and imbalanced current mirrors to draw current away from the fixed current transistor.

46. The output driver circuit of claim 16, additionally comprising means for feeding back the voltage across the inductance to the current source to change the amplitude of the current produced thereby in inverse relationship to the voltage across the inductance.

47. The output driver circuit of claim 46, in which the fixed current source is a MOS transistor having a source connected to the source of first potential, a drain connected to the gate of the transconductance device, and a gate, and means for biasing the gate, and the feeding back means comprises a connection from the junction of the inductance and the common terminal of the transconductance device to the gate to vary the bias.

48. The output driver circuit of claim 47, in which the connection comprises a capacitor.

49. The output driver circuit of claim 48, in which the biasing means comprises MOS transistor means forming a current mirror with the fixed current transistor and means responsive to the feeding back means for changing the current through the MOS transistor means, thereby changing the current through the fixed current transistor.

50. The output driver circuit of claim 49, in which the MOS transistor means comprises another fixed current source and another MOS transistor of the same conductivity type as the fixed current transistor having a source connected to the source of first power supply potential, a gate, and a drain connected to the gate, the fixed current source, and the gate of the fixed current transistor so current through the connection changes the current through the other MOS transistor.

51. The output driver circuit of claim 48, in which the biasing means comprises a source of bias potential and a resistor connecting the source of bias potential to the gate of the transistor so current fed back through the connection changes the voltage drop across the resistor.

52. An integrated circuit package comprising:
a plurality of data output package leads;
a ground package lead;
an integrated circuit chip having a plurality of binary output driver channels each comprising
a transistor with an output terminal connected to a respective data output lead;
a common terminal connected to the ground lead;
an input terminal; and
means for changing the potential at the input terminal in ramp-shaped fashion to change the output terminal from a first binary level to a second binary level; and
feedback means for decreasing the slope of the potential change at the input terminal of each transistor as the voltage between the common terminal and the ground package lead increases.

53. The integrated circuit package of claim 52, in which the transistor is a MOS transistor having as the input terminal a gate, as the output terminal a drain, and as a common terminal a source.

54. The integrated circuit package of claim 53, in which the changing means comprises a fixed current source, a capacitance connected between the gate and the source, and switching means for connecting the fixed current source to the capacitance.

55. The integrated circuit package of claim 54, in which the switching means comprises a first MOS transistor of the same conductivity type having a drain connected to the gate of the first named transistor and a second MOS transistor of complementary conductivity type having a drain connected to the drain of the first transistor, a gate connected to the gate of the first transistor, and a source connected to the fixed current source.

56. The integrated circuit package of claim 55, in which the fixed current source comprises a third MOS transistor of complementary conductivity type having a drain connected to the source of the second transistor, a gate connected to a predetermined potential, and a source connected to a power supply.

57. The integrated circuit package of claim 56, in which the feedback means comprises a single feedback connected from the source of the first named transistor to the gate of the third transistor to change the predetermined potential.

58. The integrated circuit package of claim 56, in which the feedback means comprises a common source of bias voltage as the predetermined potential, a feedback connection individual to each output driver channel comprising a capacitor from the source of the first named transistor to the gate of the third transistor, and a resistor individual to each output driver connected from the common source to the gate of the third transistor.

59. An integrated circuit package comprising:
a plurality of data output package leads;
a ground package lead having parasitic inductance; and
an integrated circuit chip having a plurality of binary output driver channels connected between the respective data output leads and the ground lead, a first power supply bus, and a second power supply bus connected to the ground package lead, each output driver circuit having
an input circuit;
means responsive to a change from a first binary input level to a second binary input level across the input circuit for connecting the first power supply bus to a respective data output lead;
a transconductance device having an input terminal, an output terminal connected to the respective data output lead, and a common terminal connected to the second power supply bus;
a capacitance connected between the input terminal and the common terminal;
a fixed current source; and
switching means responsive to a change from the second binary input level to the first binary input level across the input circuit for connecting the fixed current source to the capacitance to change the voltage across the capacitance and the current through the respective data output lead linearly.

60. The output driver circuit of claim 59, in which the transistor is a transconductance MOS transistor of given conductivity type having a gate as the input terminal, an drain as the common terminal, and a source as the output terminal.

61. The output driver circuit of claim 60, in which the means for connecting the first power supply bus to the respective data output lead is another MOS transistor of complementary conductivity type having a gate connected to the input circuit, a source connected to the first power supply bus, a drain connected to the respective data output lead, another capacitance connected between the gate and the source, another fixed current source, and another switching means responsive to a change from the first binary input level to the second binary input level for connecting the other fixed current source to the other capacitance to change the voltage across the other capacitance and the current through the respective data output lead linearly.

62. The output driver circuit of claim 60, in which the fixed current source is a MOS transistor of complementary conductivity type having a source connected to the first power supply bus, a drain connected to the gate of the transconductance MOS transistor, and a gate connected to a predetermined potential.

63. The output driver circuit of claim 62, additionally comprising a common source of bias potential connected to the gate of the fixed current transistor of each output driver channel and means for changing the bias potential in inverse relationship to the transconductance of the transconductance MOS transistors of the output driver channels.

64. The output driver circuit of claim 60, in which the switching means comprises a first switching MOS transistor of the given conductivity type having a source connected to the second power supply lead, a drain connected to the gate of the transconductance MOS transistor, and a gate to which the input circuit is connected, and a second switching MOS transistor of complementary conductivity type having a source connected to the fixed current source, a drain connected to the gate of the transconductance MOS transistor, and a gate to which the input circuit is connected.

65. The output driver circuit of claim 59, additionally comprising means for sensing changes in the voltage across the inductance and means responsive to the sensing means for changing the current through the inductance to oppose the voltage change.

66. The output driver circuit of claim 59, additionally comprising another capacitance, means for charging the other capacitance responsive to the second binary input level across the input circuit, and means for transferring part of the charge to the first named capacitance responsive to a change from the second binary input level to the first binary input level across the input circuit instantly to raise the voltage across the input terminal and the common terminal to a value near the threshold voltage of the transconductance device.

67. The output driver circuit of claim 66, in which the charging means comprises an inverter connected between the input circuit and one terminal of the other capacitance and the transferring means comprises a switch having a first end terminal connected to the other terminal of the other capacitance and the input terminal of the transconductance device and a second end terminal connected to the common terminal of the transconductance device, the switch conducting when the input circuit is at the first binary input level.

68. A circuit for reducing the level of transient noise generated during switching of an integrated circuit to drive a load capacitance, comprising:
an output driver which is activated to allow the load capacitance to selectively charge;

a package inductance representative of the inductance of the integrated circuit;

an input current received from the load capacitance during activation of the output driver, the input current passing through the package inductance;

a transconductance device having a first terminal electrically connected to the load capacitance through which said input current may pass, a second terminal to which a voltage may be applied, and a third terminal electrically connected to the package inductance of the integrated circuit, the transconductance device biasing the current applied to the first terminal to assume the same format as the voltage applied to the second terminal;

a capacitor having a first and a second terminal, the first terminal being electrically connected to the second terminal of the transconductance device;

a fixed current source connected to the first terminal of the capacitor for linearly charging the capacitor during activation of the output driver, thereby generating a linearly increasing voltage which is applied to the second terminal of the transconductance device; and a switch for selectively allowing the current from said fixed current source to charge said capacitor.

69. A circuit according to claim 68, wherein said switch is connected in parallel with said capacitor.

70. A circuit according to claim 69, wherein said switch comprises a transistor which is conductive to prevent charging of said capacitor and which is nonconductive to allow charging of said capacitor.

71. A circuit according to claim 70, wherein said transistor comprises a N-channel MOS transistor.

72. A circuit according to claim 71, wherein said switch comprises an inverter.

73. A circuit according to claim 72, wherein said inverter comprises a P-channel MOS transistor and an N-channel MOS transistor with their gates interconnected and their drains interconnected, the P-channel transistor being nonconductive when the N-channel transistor is conductive to prevent said capacitor from charging, and wherein said P-channel transistor is conductive as said N-channel transistor is nonconductive to allow said capacitor to charge.

74. A circuit according to claim 68, wherein the fixed current source includes a pair of imbalanced transistors and a resistor, wherein the imbalanced transistors create an increase in voltage across the resistor when the temperature increases to bias the current source to supply an increased level of current to the second terminal of the capacitor.

75. A circuit according to claim 74, wherein said resistor is formed of a highly doped semiconductor material.

76. A circuit according to claim 74, wherein said resistor is designed to have a predetermined resistance value, and wherein said circuit further comprises current source adjustment means for adjusting the level of current produced by said current source when said resistor has a resistance lower than said predetermined resistance value.

77. A circuit according to claim 68, wherein the current source is designed to output a current of a predetermined value, and wherein said circuit includes adjustment means for adjusting the level of the current produced by the current source when the current produced has a higher value than the predetermined value.

78. A circuit according to claim 68, further comprising current clamp means for detecting a current transient resulting from a change in the rate of change of charge in the load capacitance and providing a momentary adjustment of the current to the package inductance.

79. A circuit according to claim 78, wherein said current clamp means detects said current transient by detecting a voltage transient produced by said current transient.

80. A circuit according to claim 78, wherein the current clamp means includes an input and an output connected to the package inductance.

81. A circuit according to claim 78, wherein said current clamp means comprises:

a first MOS transistor having a gate, a source and a drain, the source being connected to the power supply voltage and the drain being connected to the package inductance;

a second MOS transistor of the same conductivity type as the first MOS transistor, said second MOS transistor having a gate, a source and a drain connected to its gate in a diode configuration, the source of second MOS transistor being connected to the power supply voltage;

a resistor connected between the drain of the second MOS transistor and the gate of the first MOS transistor;

a capacitor provided between the gate of the first MOS transistor and the package inductance; and a current source connected to the gate and drain of the second MOS transistor.

82. An integrated circuit package comprising:

a plurality of data output package leads;

a ground package lead;

an integrated circuit chip having a power supply bus and a plurality of binary output driver channels connected between the respective data output leads and the ground lead, the driver channels each comprising a transconductance device having a gate terminal and a pair of end terminals connected between a respective data output lead and the ground lead;

means for selectively switching the driver channels on and off;

means for connecting the power supply bus to the data output leads connected to the switched off driver channels;

means for maintaining a ramp shaped current through the respective channels as they are switched on, the maintaining means of each channel comprising a capacitor connected across the gate terminal and one of the end terminals, a current source, and means for coupling the source to the capacitor to charge the capacitor and to switch on the respective driver channel; and means common to all the driver channels for controlling the current supplied to the capacitors by the current source.

83. The integrated circuit package of claim 82, in which the current sources are fixed current sources.

84. The integrated circuit package of claim 83, in which the current sources are MOS transistors each having a gate, a drain connected to the capacitor, and a source connected to the power supply bus and the controlling means is a common voltage source connected to the gate of the current source MOS transistors.

85. The integrated circuit package of claim 84, in which the amplitude of the common voltage source increases as the voltage amplitude of the power supply bus decreases.

* * * * *